United States Patent
Ishiduki et al.

(10) Patent No.: US 8,426,976 B2
(45) Date of Patent: Apr. 23, 2013

(54) NON-VOLATILE SEMICONDUCTOR STORAGE DEVICE AND METHOD OF MANUFACTURING THE SAME

(75) Inventors: Megumi Ishiduki, Yokohama (JP); Hideaki Aochi, Kawasaki (JP); Ryota Katsumata, Yokohama (JP); Hiroyasu Tanaka, Tokyo (JP); Masaru Kidoh, Komae (JP); Masaru Kito, Yokohama (JP); Yoshiaki Fukuzumi, Yokohama (JP); Yosuke Komori, Yokohama (JP); Yasuyuki Matsuoka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 396 days.

(21) Appl. No.: 12/392,636

(22) Filed: Feb. 25, 2009

(65) Prior Publication Data

US 2009/0230458 A1 Sep. 17, 2009

(30) Foreign Application Priority Data

Mar. 14, 2008 (JP) .................................. 2008-65886

(51) Int. Cl.
*H01L 29/792* (2006.01)
*H01L 21/28* (2006.01)

(52) U.S. Cl.
USPC .................... 257/774; 257/324; 257/E29.309; 257/E21.21; 438/589

(58) Field of Classification Search ................... 257/774, 257/324, 326, E29.3
See application file for complete search history.

(56) References Cited

U.S. PATENT DOCUMENTS

| | | | |
|---|---|---|---|
| 6,727,544 B2 | 4/2004 | Endoh et al. | |
| 6,870,215 B2 | 3/2005 | Endoh et al. | |
| 2007/0252201 A1* | 11/2007 | Kito et al. .................... 257/331 |
| 2008/0173933 A1 | 7/2008 | Fukuzumi et al. | |

FOREIGN PATENT DOCUMENTS

| | | |
|---|---|---|
| JP | 10-32269 | 2/1998 |
| JP | 2003-7868 | 1/2003 |
| JP | 2003-92366 | 3/2003 |
| JP | 2007-266143 | 10/2007 |
| JP | 2008-181978 | 8/2008 |
| JP | 2008-277543 | 11/2008 |
| JP | 2009-158775 | 7/2009 |

OTHER PUBLICATIONS

U.S. Appl. No. 12/132,181, filed Jun. 3, 2008, Hiroyasu Tanaka et al.
U.S. Appl. No. 12/708,161, filed Feb. 18, 2010, Fukuzumi et al.
Decision of Refusal issued Oct. 26, 2010, in Japanese Patent Application No. 2008-065886 (with English-language translation).

* cited by examiner

*Primary Examiner* — Jarrett Stark
*Assistant Examiner* — Lawrence Tynes, Jr.
(74) *Attorney, Agent, or Firm* — Oblon, Spivak, McClelland, Maier & Neustadt, L.L.P.

(57) ABSTRACT

A non-volatile semiconductor storage device has a plurality of memory strings with a plurality of electrically rewritable memory cells connected in series. Each of the memory strings includes: a columnar semiconductor layer extending in a direction perpendicular to a substrate; a plurality of conductive layers formed at a sidewall of the columnar semiconductor layer via memory layers; and interlayer insulation layers formed above of below the conductive layers. A sidewall of the conductive layers facing the columnar semiconductor layer is formed to be inclined such that the distance thereof from a central axis of the columnar semiconductor layer becomes larger at lower position thereof than at upper position thereof. While, a sidewall of the interlayer insulation layers facing the columnar semiconductor layer is formed to be inclined such that the distance thereof from a central axis of the columnar semiconductor layer becomes smaller at lower position thereof than at upper position thereof.

18 Claims, 15 Drawing Sheets

NON-VOLATILE SEMICONDUCTOR STORAGE DEVICE AND METHOD OF MANUFACTURING THE SAME

CROSS-REFERENCE TO RELATED APPLICATIONS

This application is based upon and claims the benefit of priority from the prior Japanese Patent Application No. 2008-65886, filed on Mar. 14, 2008, the entire contents of which are incorporated herein by reference.

BACKGROUND OF THE INVENTION

1. Field of the Invention

The present invention relates to an electrically rewritable non-volatile semiconductor storage device and a method of manufacturing the same.

2. Description of the Related Art

Conventionally, LSIs are formed by integration of devices in a two-dimensional plane on the silicon substrate. Although some measures have been taken to reduce the dimension for each device (refinement) to increase memory storage capacity, recent years are facing challenges in such refinement from the viewpoint of cost and technology. Such refinement requires further improvements in photolithography technology. However, in currently available ArF immersion lithography technology, for example, the resolution limit has been reached around the 40 nm design rule and so EUV exposure devices have to be introduced for further refinement. However, the EUV exposure devices are expensive and infeasible in view of the costs. In addition, if such refinement is accomplished, it is assumed that physical improvement limit, such as in breakdown voltage between devices, would be reached unless driving voltage can be scaled. Thus, it is likely that difficulties would be encountered in device operation itself.

Therefore, a large number of semiconductor storage devices have been proposed recently where memory cells are arranged in a three-dimensional manner to achieve improved integration of memory devices (see, Japanese Patent Laid-Open No. 2007-266143).

One of the conventional semiconductor storage devices where memory cells are arranged in a three-dimensional manner uses transistors with cylinder-type structure (Patent Document 1). Those semiconductor storage devices using transistors with cylinder-type structure are provided with multiple laminated conductive layers, corresponding to gate electrodes, and pillar-like columnar semiconductors. Each of the columnar semiconductors serves as a channel (body) part of each of the transistors. Charge accumulation layers that can accumulate charges are provided around the columnar semiconductors. Such configuration including laminated conductive layers, columnar semiconductors, and memory gate insulation layers is referred to as a "memory string".

In the semiconductor storage device with the memory strings, reliability of the memory gate insulation layers of, and data retaining characteristics of the semiconductor storage device are determined by a structure and a manufacturing method of the charge accumulation layers.

For example, conventional methods of manufacturing memory strings are generally explained as follows. Firstly, a hole is formed to penetrate laminated conductive layers and interlayer insulation layers that are alternately laminated on the silicon (Si) substrate. Then, a block insulation layer and a charge accumulation layer (SiN) are formed on the respective side surfaces, facing the hole, of the laminated conductive layers and the interlayer insulation layers. Thereafter, any material, such as silicon nitride (SiN) or silicon oxide ($SiO_2$), is removed from the bottom portion of the hole by Reactive Ion Etching (RIE) for establishing a contact with the conductive layer or the silicon (Si) substrate that is provided below the hole. At this moment, in addition to the bottom portion of the hole, the block insulation layer (gate insulation layer) facing the laminated conductive layers could also be damaged by RIE, which would be a major cause of gate leakage. Therefore, with the conventional manufacturing methods as mentioned above, erroneous write operations to irrelevant cells could occur.

In addition, for example, with the conventional structure, a charge accumulation layer is formed over the multiple laminated conductive layers. Therefore, charges can diffuse in the charge accumulation layer, which may result in degradation of data retaining characteristics.

SUMMARY OF THE INVENTION

One aspect of the present invention provides a non-volatile semiconductor storage device comprising a plurality of memory strings with a plurality of electrically rewritable memory cells connected in series, each of the memory strings comprising: a columnar semiconductor layer extending in a direction perpendicular to a substrate; a plurality of conductive layers formed at a sidewall of the columnar semiconductor layer via memory layers; and interlayer insulation layers formed above or below the conductive layers, a sidewall of the conductive layers facing the columnar semiconductor layer being formed to be inclined such that the distance thereof from a central axis of the columnar semiconductor layer becomes larger at lower position thereof than at upper position thereof, and a sidewall of the interlayer insulation layers facing the columnar semiconductor layer being formed to be inclined such that the distance thereof from a central axis of the columnar semiconductor layer becomes smaller at lower position thereof than at upper position thereof.

Another aspect of the present invention provides a non-volatile semiconductor storage device comprising a plurality of memory strings with a plurality of electrically rewritable memory cells connected in series, each of the memory strings comprising: a columnar semiconductor layer extending in a direction perpendicular to a substrate; a plurality of conductive layers formed at the side of the sidewall of the columnar semiconductor layer via memory layers; and interlayer insulation layers formed one above the other with the conductive layers, a sidewall of the conductive layers facing the columnar semiconductor layer being formed at positions farther away from the columnar semiconductor layer than a sidewall of the interlayer insulation layers facing the columnar semiconductor layer.

Yet another aspect of the present invention provides a method of manufacturing a non-volatile semiconductor storage device having a plurality of memory strings with a plurality of electrically rewritable memory cells connected in series, the method comprising: alternately laminating conductive layers and interlayer insulation layers; forming a hole to penetrate the plurality of conductive layers and interlayer insulation layers; forming a memory gate insulation layer on respective sidewalls, facing the hole, of the conductive layers and interlayer insulation layers; and forming a columnar semiconductor layer to fill up the hole, a sidewall of the conductive layers facing the columnar semiconductor layer being formed to be inclined such that the distance thereof from a central axis of the columnar semiconductor layer becomes larger at lower position thereof than at upper position thereof, and a sidewall of the interlayer insulation layers facing the columnar semiconductor layer being formed to be inclined such that the distance thereof from a central axis of the columnar semiconductor layer becomes smaller at lower position thereof than at upper position thereof.

DETAILED DESCRIPTION OF THE EMBODIMENTS

Embodiments of a non-volatile semiconductor storage device and a method of manufacturing the same according to the present invention will now be described below with reference to the accompanying drawings.

First Embodiment

Figure 1:
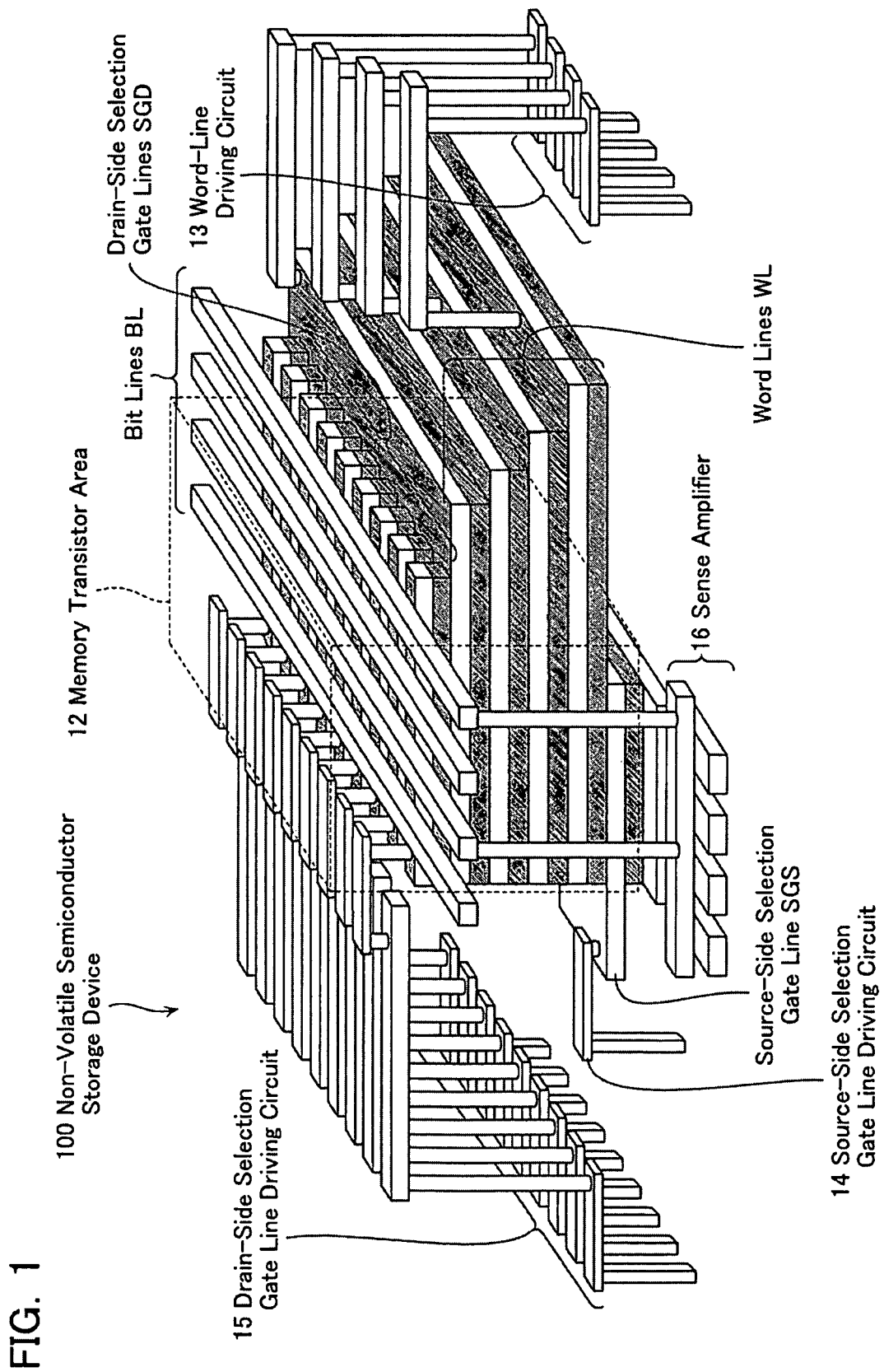
FIG. 1 is a schematic diagram illustrating a configuration of a non-volatile semiconductor storage device according to a first embodiment of the present invention.

Configuration of Non-Volatile Semiconductor Storage Device 100 in First Embodiment FIG. 1 schematically illustrates a non-volatile semiconductor storage device 100 according to a first embodiment of the present invention. As illustrated in FIG. 1, the non-volatile semiconductor storage device 100 according to the first embodiment mainly comprises: a memory transistor area 12; a word-line driving circuit 13; a source-side selection gate line (SGS) driving circuit 14; a drain-side selection gate line (SGD) driving circuit 15; and a sense amplifier 16. The memory transistor area 12 has memory transistors for storing data. The word-line driving circuit 13 controls voltage applied to word lines WL. The source-side selection gate line (SGS) driving circuit 14 controls voltage applied to the source-side selection gate line SGS. The drain-side selection gate line (SGD) driving circuit 15 controls voltage applied to drain-side selection gate lines (SGD). The sense amplifier 16 amplifies a potential read from a memory transistor. In addition to this, the non-volatile semiconductor storage device 100 according to the first embodiment comprises a bit-line driving circuit for controlling voltage applied to bit lines BL and a source-line driving circuit for controlling voltage applied to source lines SL (not illustrated).

In addition, as illustrated in FIG. 1, in the non-volatile semiconductor storage device 100 according to the first embodiment, the memory transistors that configure the memory transistor area 12 are formed by lamination of a plurality of semiconductor layers.

Figure 2:
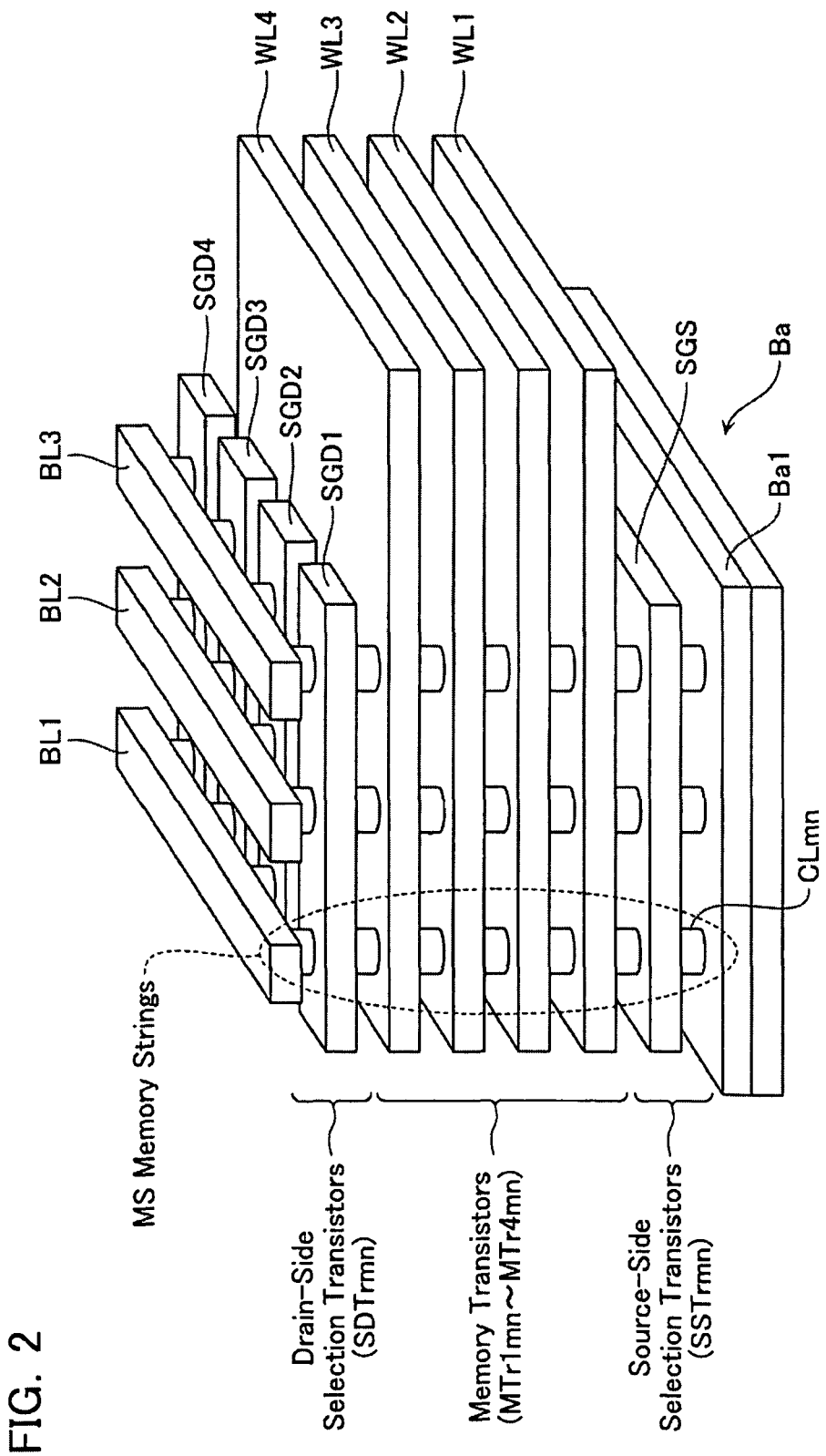
FIG. 2 is a perspective view schematically illustrating a part of the memory transistor area 12 in the non-volatile semiconductor storage device according to the first embodiment of the present invention.

FIG. 2 is a perspective view schematically illustrating a part of the memory transistor area 12 in the non-volatile semiconductor storage device 100 according to the first embodiment. According to the first embodiment, the memory transistor area 12 has m×n (m, n=natural number) memory strings MS, each of which includes memory transistors MTr1$mn$ to MTr4$mn$, a source-side selection transistor SSTrmn, and a drain-side selection transistor SDTrmn. In FIG. 2, given that m=3, n=4.

In each of the memory strings MS, each of word lines (WL1 to WL4) connected to the gate of each of the memory transistors MTr1$mn$ to MTr4$mn$ is formed by the same conductive layer and used in common therein. That is, in the memory strings MS, all gates of the memory transistors MTr1$mn$ are connected to the word line WL1. In addition, in the memory strings MS, all gates of the memory transistors MTr2$mn$ are connected to the word line WL2. In addition, in the memory strings MS, all gates of the memory transistors MTr3$mn$ are connected to the word line WL3. In addition, in the memory strings MS, all gates of the memory transistors MTr4$mn$ are connected to the word line WL4. As illustrated in FIGS. 1 and 2, in the non-volatile semiconductor storage device 100 according to the first embodiment, each of the word lines WL1 to WL4 is formed to expand in a two-dimensional manner in the horizontal direction parallel to the semiconductor substrate Ba. In addition, the word lines WL1 to WL4 are arranged substantially perpendicular to the respective memory strings MS. In addition, the row-direction ends of the word lines WL1 to WL4 are formed in a stepwise manner in relation to each other. Wherein, the row direction represents a direction orthogonal to the vertical direction and the column direction represents another orthogonal to the vertical direction and the row direction.

Each of the memory strings MS has columnar semiconductors CLmn (in the case of FIG. 2, m=1 to 3, n=1 to 4) provided on an $n^+$ area that is formed on a P-well area Ba1 on a semiconductor substrate Ba. Each of the columnar semiconductors CLmn is formed in a direction perpendicular to the semiconductor substrate Ba and arranged in a matrix form on the respective surfaces of the semiconductor substrate Ba and the word lines (WL1 to WL4). That is, each of the memory strings MS is also arranged in a matrix form within a plane perpendicular to the corresponding columnar semiconductor CLmn. Note that the columnar semiconductors CLmn may be columnar or prismatic in shape. In addition, the columnar semiconductors CLmn include terraced columnar semiconductors.

Further, as illustrated in FIG. 2, provided on the upper portions of the memory strings MS are drain-side selection gate lines SGD with rectangular plate shapes (in the case of FIG. 2, SGD1 to SGD4), which contact columnar semiconductors CLmn via insulating films (not illustrated) to configure respective drain-side selection transistors SDTrmn. The drain-side selection gate lines SGD are insulated and isolated from each other and, unlike the word lines WL1 to WL4, formed to extend in the row direction and formed in lines repeatedly provided in the column direction. In addition, columnar semiconductors CLmn are provided to penetrate the center in the column direction of the drain-side selection gate lines SGD.

Further, as illustrated in FIG. 2, provided on the lower portions of the memory strings MS is a source-side selection gate line SGS, which contact the columnar semiconductors CLmn via insulating films (not illustrated) to configure respective source-side selection transistors SSTrmn. As with the word lines WL1 to WL4, the source-side selection gate line SGS is formed to expand in a two-dimensional manner in the horizontal direction. Note that, in addition to the structure as illustrated in FIG. 2, the source-side selection gate line SGS may be formed to extend in the row direction and formed in strips repeatedly provided in the column direction.

Figure 3:
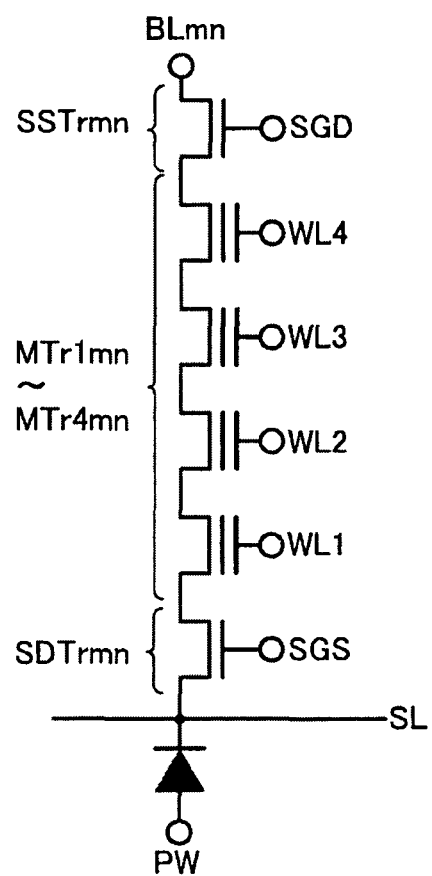
FIG. 3 is a circuit diagram illustrating one memory string MS according to the first embodiment of the present invention.

Referring now to FIGS. 2 and 3, the circuit configuration and operation of the memory strings MS of the first embodiment will be described below. FIG. 3 is a circuit diagram illustrating one memory string MS according to the first embodiment.

As illustrated in FIGS. 2 and 3, in the first embodiment, each of the memory strings MS has four memory transistors MTr1*mn* to MTr4*mn* as well as the source-side selection transistor SSTrmn and the drain-side selection transistor SDTrmn. These four memory transistors MTr1*mn* to MTr4*mn* as well as the source-side selection transistor SSTrmn and the drain-side selection transistor SDTrmn are connected in series to each other (see FIG. 3). According to the first embodiment, in each of the memory strings MS, a columnar semiconductor CLmn is formed on an $n^+$ area that is formed on the $p^-$ type area (P-well area) Ba1 on the semiconductor substrate Ba.

In addition, a source line SL (an $n^+$ area formed on the P-well area Ba1 on the semiconductor substrate Ba) is connected to the source of each source-side selection transistor SSTrmn. Further, a bit line BL is connected to the drain of each drain-side selection transistor SDTrmn.

Each of the memory transistors MTrmn has a columnar semiconductor CLmn, a charge accumulation layer (memory layer) formed to surround the columnar semiconductor CLmn, and a word line WL formed to surround the charge accumulation layer. Each word line WL functions as a control gate electrode of the corresponding memory transistor MTrmn.

In the non-volatile semiconductor storage device 100 with the above-mentioned configuration, respective voltages of the bit lines BL1 to BL3, the drain-side selection gate lines SGD, the word lines WL1 to WL4, the source-side selection gate line SGS, and the source lines SL are controlled by bit line driving circuits (not illustrated), the drain-side selection gate line driving circuit 15, the word line driving circuits 13, the source-side selection gate line driving circuit 14, and a source line driving circuit (not illustrated). That is, data is written and erased by controlling charges of the charge accumulation layer in a predetermined memory transistor MTrmn.

(Specific Configuration of Non-Volatile Semiconductor Storage Device 100 in First Embodiment)

Figure 4:
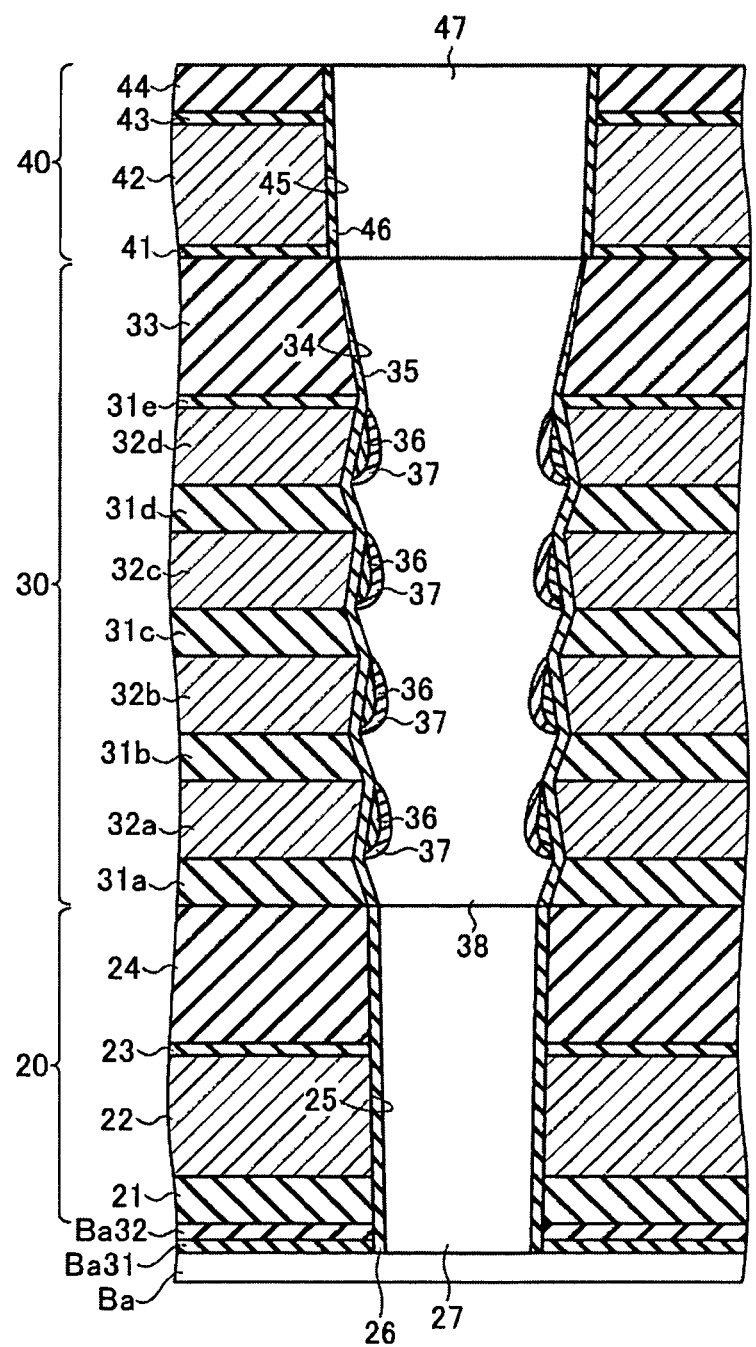
FIG. 4 is a cross-sectional view of the non-volatile semiconductor storage device configuring one memory string MS according to the first embodiment.

Referring now to FIG. 4, a further specific configuration of the non-volatile semiconductor storage device 100 will be described below. FIG. 4 is a cross-sectional view of the non-volatile semiconductor storage device configuring one memory string MS according to the first embodiment. As illustrated in FIG. 4, in the memory transistor area 12, the non-volatile semiconductor storage device 100 (one memory string MS) has, from lower layer to upper layer, a source-side selection transistor layer 20, a memory transistor layer 30, and a drain-side selection transistor layer 40 on the semiconductor substrate Ba. The source-side selection transistor layer 20 functions as a source-side selection transistor SSTrmn. The memory transistor layer 30 functions as a memory transistor MTrmn. The drain-side selection transistor layer 40 functions as a drain-side selection transistor SDTrmn.

A first insulation layer Ba31 and a second insulation layer Ba32 are formed on the semiconductor substrate Ba. The first insulation layer Ba31 is composed of silicon nitride (SiN). The second insulation layer Ba32 is composed of TEOS.

The source-side selection transistor layer 20 has a source-side first insulation layer 21, a source-side conductive layer 22, a source-side second insulation layer 23, and a source-side isolation/insulation layer 24 that are sequentially laminated on the semiconductor substrate Ba.

The source-side first insulation layer 21, the source-side conductive layer 22, the source-side second insulation layer 23, and the source-side isolation/insulation layer 24 are each formed to expand in a two-dimensional manner at the memory transistor area 12 in the horizontal direction parallel to the semiconductor substrate Ba. The source-side first insulation layer 21, the source-side conductive layer 22, the source-side second insulation layer 23, and the source-side isolation/insulation layer 24 are arranged separately for each predetermined area (erase unit) in the memory transistor area 12.

The source-side first insulation layer 21 and the source-side second insulation layer 23 are composed of silicon oxide ($SiO_2$). The source-side conductive layer 22 is composed of, e.g., $p^+$ type polysilicon (polycrystalline silicon). The source-side isolation/insulation layer 24 is composed of silicon nitride (SiN).

In addition, a source-side hole 25 is formed to penetrate the source-side isolation/insulation layer 24, the source-side second insulation layer 23, the source-side conductive layer 22, the source-side first insulation layer 21, the second insulation layer Ba32, and the first insulation layer Ba31. A source-side gate insulation layer 26 and a source-side columnar semiconductor layer 27 are sequentially provided on the sidewall facing the source-side hole 25.

The source-side gate insulation layer 26 is formed by silicon oxide ($SiO_2$). The source-side columnar semiconductor layer 27 is formed by polysilicon (polycrystalline silicon). In addition, the upper portion of the source-side columnar semiconductor layer 27 may be composed of $n^+$ type polysilicon.

In addition, in the source-side selection transistor layer 20, the source-side conductive layer 22 functions as the source-side selection gate line SGS. Further, the source-side conductive layer 22 functions as the control gate of the source-side selection transistor SSTrmn.

The memory transistor layer 30 has first to fifth inter-wordline insulating layers 31a to 31e that are provided above the source-side isolation/insulation layer 24 and the interlayer insulation layer 26, first to fourth wordline conductive layers 32a to 32d that are provided one above the other with the first to fifth inter-wordline insulating layers 31a to 31e, as well as a memory isolation/insulation layer 33 that is laminated on the fifth inter-wordline insulating layers 31e.

The first to fifth inter-wordline insulating layers 31a to 31e, the first to fourth wordline conductive layers 32a to 32d, as well as the memory isolation/insulation layer 33 are each formed to expand in a two-dimensional manner in the row and column directions, and formed in a stepwise manner in relation to each other at their row-direction ends.

The first to fifth inter-wordline insulating layers 31a to 31e are composed of silicon oxide ($SiO_2$). The first to fourth wordline conductive layers 32a to 32d are composed of $p^+$ type polysilicon (polycrystalline silicon). The memory isolation/insulation layer 33 is composed of silicon nitride (SiN).

In addition, the memory transistor layer 30 has a memory hole 34 formed therein so as to penetrate the memory isolation/insulation layer 33, the first to fifth inter-wordline insulating layers 31a to 31e, and the first to fourth wordline conductive layers 32a to 32d. The memory hole 34 is provided at a position matching the source-side hole 25.

A block insulation layer (first insulation layer) 35, charge accumulation layers (memory layers) 36, tunnel insulation layers (second insulation layers) 37, and a memory columnar semiconductor layer 38 are provided in the memory hole 34. The memory columnar semiconductor layer 38 is formed to extend in a direction substantially perpendicular to the semiconductor substrate Ba.

In this case, A sidewall of the first to fourth wordline conductive layers 32a to 32d facing the memory columnar semiconductor layer 38 is formed to be inclined such that the distance thereof from a central axis of the columnar semiconductor layer 38 becomes larger at lower position thereof than at upper position thereof. On the other hand, a sidewall of the first to fifth inter-wordline insulating layers 31a to 31e facing the memory columnar semiconductor layer 38 is formed to be inclined such that the distance thereof from a central axis of the columnar semiconductor layer 38 becomes smaller at lower position thereof than at upper position thereof. In other words, the respective sidewalls of the first to fifth inter-wordline insulating layers 31a to 31e and the first to fourth wordline conductive layers 32a to 32d facing the memory columnar semiconductor layer 38 are formed in a continuous sawtooth pattern.

The block insulation layer 35, the charge accumulation layers 36, and the tunnel insulation layers 37 are sequentially formed on the sidewalls of the first to fourth wordline conductive layers 32a to 32d. The block insulation layer 35 is also formed on the sidewalls of the first to fifth inter-wordline insulating layers 31a to 31e. The block insulation layer 35 is formed in common and continuously with the first to fifth inter-wordline insulating layers 31a to 31e and the first to fourth wordline conductive layers 32a to 32d. On the contrary, the charge accumulation layers 36 and the tunnel insulation layers 37 are formed separately for each of the first to fourth wordline conductive layers 32a to 32d, and not formed on the sidewalls of the first to fifth inter-wordline insulating layers 31a to 31e.

The block insulation layer 35 and the tunnel insulation layers 37 are formed by silicon oxide ($SiO_2$). The charge accumulation layers 36 are formed by silicon nitride (SiN). The charge accumulation layers 36 are formed to be able to accumulate charges. The memory columnar semiconductor layer 38 is composed of polysilicon (polycrystalline silicon). In addition, the upper portion of the memory columnar semiconductor layer 38 may be composed of $n^+$ type polysilicon.

Note that the above-mentioned configuration is restated as follows: the block insulation layer 35 is provided between the respective charge accumulation layers 36 and the sidewalls of the first to fourth wordline conductive layers 32a to 32d, as well as between the memory columnar semiconductor layer 38 and the sidewalls of the first to fifth inter-wordline insulating layers 31a to 31e. The tunnel insulation layers 37 are formed between the respective sidewalls of the charge accumulation layers 36 and the sidewall of the memory columnar semiconductor layer 38.

In the memory transistor layer 30, the first to fourth wordline conductive layers 32a to 32d function as the word lines WL1 to WL4. In addition, the first to fourth wordline conductive layers 32a to 32d function as the control gates of the memory transistors MTrmn.

The drain-side selection transistor layer 40 has a drain-side first insulation layer 41, a drain-side conductive layer 42, a drain-side second insulation layer 43, and a drain-side isolation/insulation layer 44 that are sequentially laminated on the memory isolation/insulation layer 33.

The drain-side first insulation layer 41, the drain-side conductive layer 42, the drain-side second insulation layer 43, and the drain-side isolation/insulation layer 44 are provided at positions matching the upper portion of the memory columnar semiconductor layer 38, and they are formed to extend in the row direction and formed in lines repeatedly provided in the column direction.

The drain-side first insulation layer 41 and the drain-side second insulation layer 43 are formed by silicon oxide ($SiO_2$). The drain-side conductive layer 42 is formed by, e.g., $p^+$ type polysilicon (polycrystalline silicon). The drain-side conductive layer 42 may be formed by, e.g., n-type polysilicon (polycrystalline silicon). The drain-side isolation/insulation layer 44 is formed by silicon nitride (SiN).

In addition, the drain-side selection transistor layer 40 has a drain-side hole 45 formed therein so as to penetrate the drain-side isolation/insulation layer 44, the drain-side second insulation layer 43, the drain-side conductive layer 42, and the drain-side first insulation layer 41. The drain-side hole 45 is provided at a position matching the memory hole 34. A drain-side gate insulation layer 46 and a drain-side columnar semiconductor layer 47 are sequentially provided on the sidewall facing the drain-side hole 45.

The drain-side gate insulation layer 46 is formed by silicon oxide ($SiO_2$). The drain-side columnar semiconductor 47 is formed by polysilicon (polycrystalline silicon). In addition, the upper portion of the drain-side columnar semiconductor layer 47 is composed of n+ type polysilicon.

In addition, in the drain-side selection transistor layer 40, the drain-side conductive layer 42 functions as a drain-side selection gate line SGD. In addition, the drain-side conductive layer 42 functions as the control gate of the corresponding drain-side selection transistor SDTrmn.

(Manufacturing Process of Non-Volatile Semiconductor Storage Device 100 in First Embodiment)

Referring now to FIGS. 5 to 10, the manufacturing process of the non-volatile semiconductor storage device 100 according to the first embodiment will be described below. Specifically, FIGS. 5 to 10 illustrate the manufacturing process of the memory transistor layer 30. Note that FIGS. 5 to 10 mainly illustrate the memory transistor layer 30 and that the source-side selection transistor layer 20 and the drain-side selection transistor layer 40 are omitted therefrom.

Figure 5:
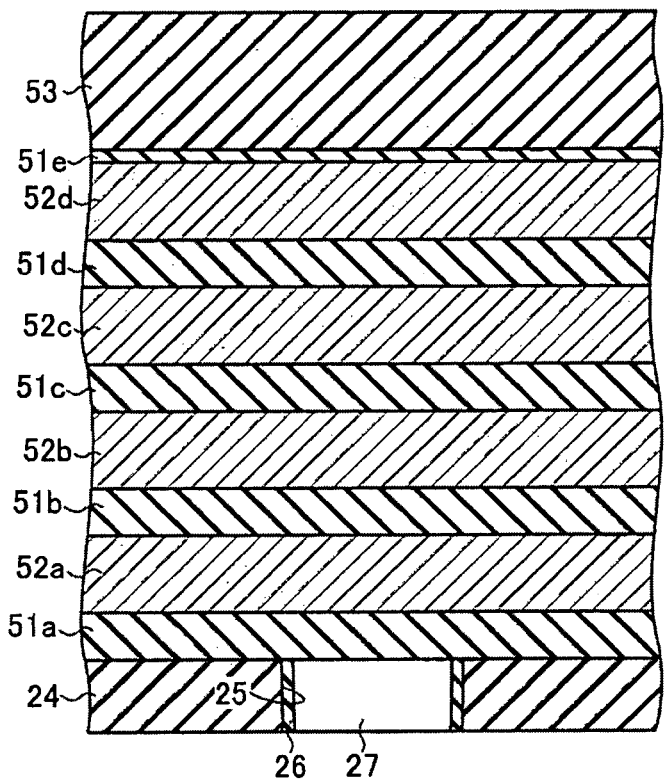
FIG. 5 is a cross-sectional view of the non-volatile semiconductor storage device in a manufacturing process according to the first embodiment.

Firstly, as illustrated in FIG. 5, silicon oxide ($SiO_2$) 51a to 51e and p+ type polysilicon (polycrystalline silicon) 52a to 52d are alternately laminated in sequence on the source-side selection transistor layer 20 (the source-side isolation/insulation layer 24 as well as the source-side columnar semiconductor layer 27), on which silicon nitride (SiN) 53 is then deposited.

Figure 6:
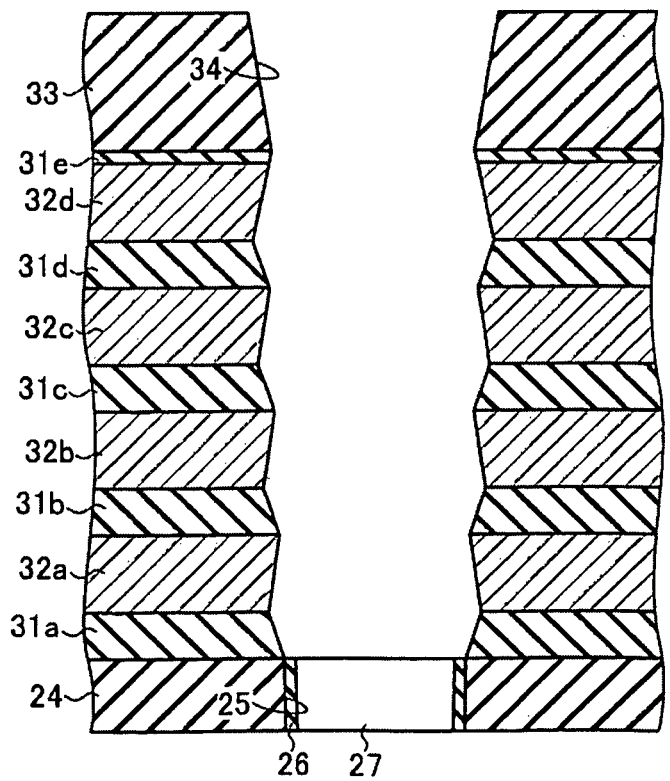
FIG. 6 is a cross-sectional view of the non-volatile semiconductor storage device in the manufacturing process according to the first embodiment.

Then, as illustrated in FIG. 6, a memory hole 34 is formed at a position matching the source-side hole 25 by RIE so as to penetrate the silicon nitride (SiN) 53, the silicon oxide ($SiO_2$) 51a to 51e, and the polysilicon (polycrystalline silicon) 52a to 52d. Through this process, the silicon oxide ($SiO_2$) 51a to 51e become first to fifth inter-wordline insulating layers 31a to 31e. In addition, the polysilicon (polycrystalline silicon) 52a to 52d become first to fourth wordline conductive layers 32a to 32d. In addition, the silicon nitride (SiN) 53 becomes a memory isolation/insulation layer 33.

In addition, in the step illustrated in FIG. 6, by continuously changing etching conditions of RIE, the memory hole 34 is formed in such a way that the sidewalls of the first to fourth wordline conductive layers 32a to 32d are inclined such that the distance thereof from a central axis of the memory hole 34 becomes larger at lower position thereof than at upper position thereof. The memory hole 34 is also formed in such a way that the sidewalls of the first to fifth inter-wordline insulating layers 31a to 31e are inclined such that the distance thereof from a central axis of the memory hole 34 becomes smaller at lower position thereof than at upper position thereof. The etching conditions of RIE include, for example, the type of gas and temperature to be used.

Figure 7:
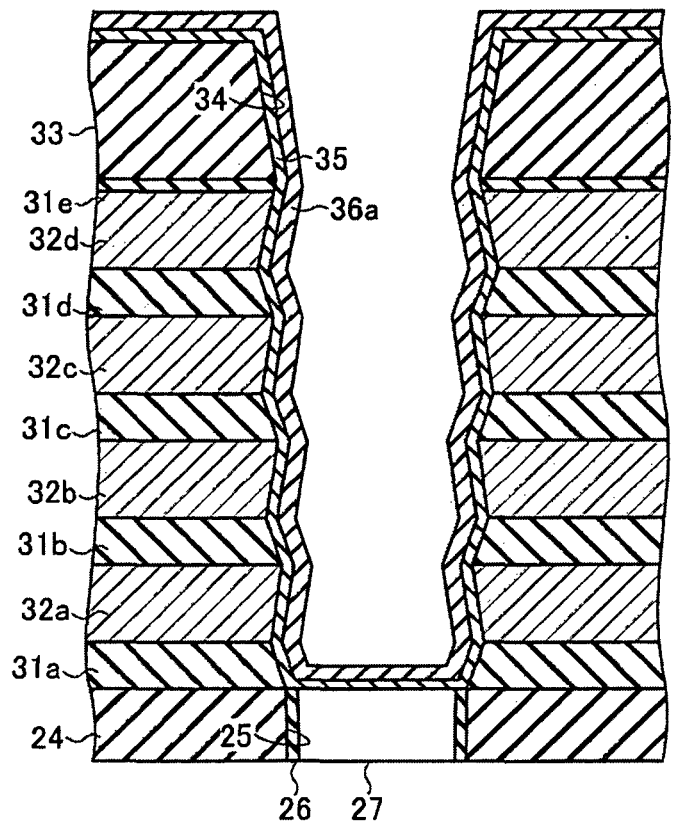
FIG. 7 is a cross-sectional view of the non-volatile semiconductor storage device in the manufacturing process according to the first embodiment.

Then, as illustrated in FIG. 7, silicon oxide ($SiO_2$) 35 and silicon nitride (SiN) 36a are sequentially laminated in the memory hole 34. For example, provided that the silicon oxide ($SiO_2$) 35 is 5 nm thick, while the silicon nitride (SiN) 36a is 10 nm thick. In the above-mentioned process, the silicon oxide ($SiO_2$) 35 functions as the block insulation layer 35.

Figure 8:
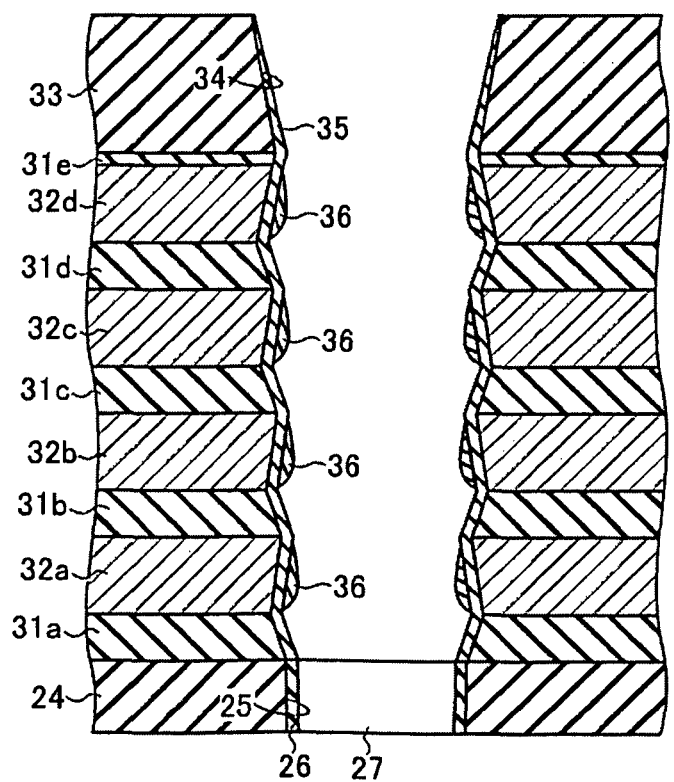
FIG. 8 is a cross-sectional view of the non-volatile semiconductor storage device in the manufacturing process according to the first embodiment.

Subsequently, RIE is performed as illustrated in FIG. 8. Through this RIE process, those portions of the silicon nitride (SiN) 36a and the silicon oxide (SiO2) 35 are removed that are located on the source-side columnar semiconductor layer 27 (the bottom portion of the memory hole 34), by which a contact with the source-side columnar semiconductor layer 27 can be established. Further, through the RIE process illustrated in FIG. 8, those portions of the block insulation layer 35 and the silicon nitride (SiN) 36a are removed that are formed on the top surface of the memory isolation/insulation layer 33. In this case, the sidewalls of the first to fourth wordline conductive layers 32a to 32d as well as the sidewalls of the first to fifth inter-wordline insulating layers 31a to 31e are formed with an inclination as described above. Accordingly, those silicon nitride (SiN) 36a formed on the sidewalls of the first to fourth wordline conductive layers 32a to 32d have a smaller area subject to the etching ion irradiation by RIE than those silicon nitride (SiN) 36a formed on the sidewalls of the first to fifth inter-wordline insulating layers 31a to 31e. That is, through this process, the silicon nitride (SiN) 36a remains only on the sidewalls of the first to fourth wordline conductive layers 32a to 32d. The remaining silicon nitride (SiN) 36a functions as a charge accumulation layer 36.

Figure 9:
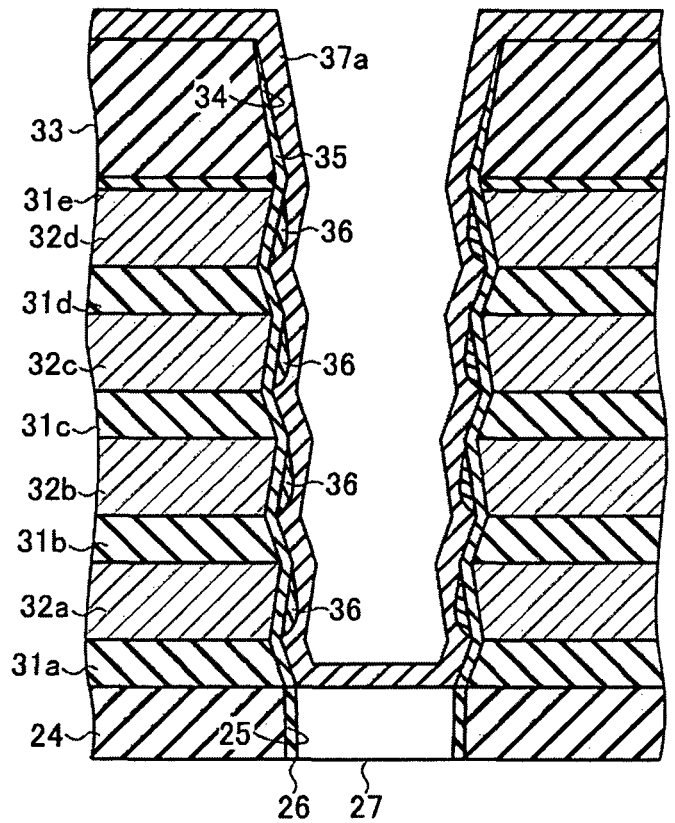
FIG. 9 is a cross-sectional view of the non-volatile semiconductor storage device in the manufacturing process according to the first embodiment.

Then, silicon oxide ($SiO_2$) 37a is deposited as illustrated in FIG. 9.

Figure 10:
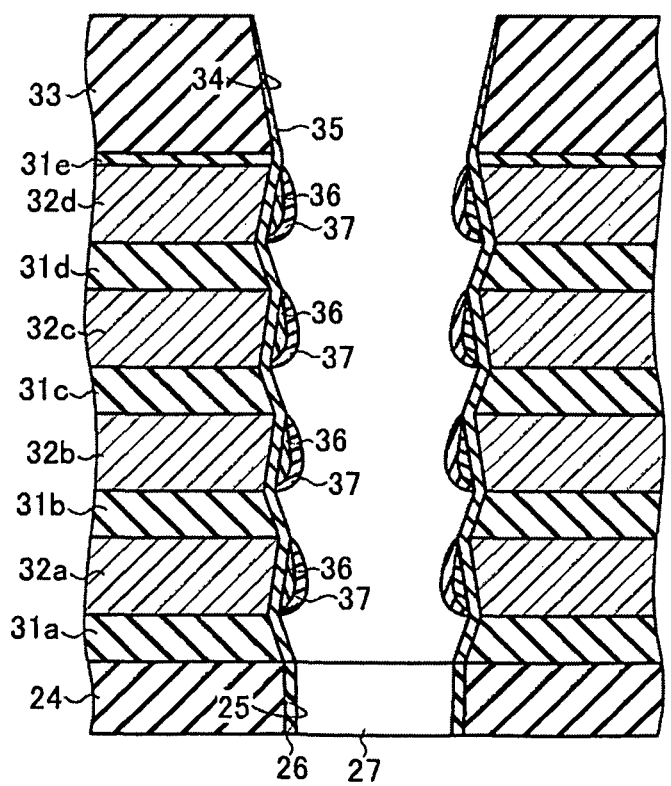
FIG. 10 is a cross-sectional view of the non-volatile semiconductor storage device in the manufacturing process according to the first embodiment.

Subsequently, RIE process is performed as illustrated in FIG. 10. Through this RIE process, those portions of the silicon oxide ($SiO_2$) 37a are removed that are formed on the top surface of the memory isolation/insulation layer 33. In addition, the silicon oxide ($SiO_2$) 37a remains only on the charge accumulation layers 36 (at the sidewalls of the first to fourth wordline conductive layers 32a to 32d) for a similar reason to the step of forming the charge accumulation layers 36. The remaining silicon oxide ($SiO_2$) 37a functions as a tunnel insulation layer 37.

Then, after the step illustrated in FIG. 10, a diluted hydrofluoric acid treatment is performed to remove any natural oxide film that is exposed on the source-side columnar semiconductor layer 27. In this case, the tunnel insulation layers 37 remain substantially unetched by the diluted hydrofluoric acid treatment for a similar reason to the step of forming the charge accumulation layers 36 and the tunnel insulation layers 37. Subsequently, amorphous silicon (a-Si) is deposited in the memory hole 34, on which RIE process and heat treatment are then performed. Through this process, a memory columnar semiconductor layer 38 is formed in the memory hole 34. In addition, at this moment, impurity ion may be injected into the upper end of the memory columnar semiconductor layer 38, and n+ type polysilicon can be provided on the upper portion of the memory columnar semiconductor layer 38, accordingly. Through the above-mentioned process, the memory transistor layer 30 is formed as illustrated in FIG. 4.

(Advantages of Non-Volatile Semiconductor Storage Device 100 in First Embodiment)

Advantages of the non-volatile semiconductor storage device 100 according to the first embodiment will now be described below. As can be seen from the above lamination structure, the non-volatile semiconductor storage device 100 according to the first embodiment may achieve high integration. In addition, as described in the above manufacturing processes of the non-volatile semiconductor storage device 100, each layer corresponding to a respective memory transistor MTrmn, source-side selection transistors SSTrmn, and drain-side selection transistors SDTrmn may be manufactured in a predetermined number of lithography steps, irrespective of the number of laminated layers. That is, the non-volatile semiconductor storage device 100 may be manufactured at a lower cost.

In addition, in the non-volatile semiconductor storage device 100 according to the first embodiment of the present invention, the sidewall of the first to fourth wordline conductive layers 32a to 32d facing the memory columnar semiconductor layer 38 is formed to be inclined such that the distance thereof from a central axis of the columnar semiconductor layer 38 becomes larger at lower position thereof than at upper position thereof. Further, the sidewall of the first to fifth inter-wordline insulating layers 31a to 31e facing the memory columnar semiconductor layer 38 is formed to be inclined such that the distance thereof from a central axis of the columnar semiconductor layer 38 becomes smaller at lower position thereof than at upper position thereof. With this configuration, the charge accumulation layers 36 and the tunnel insulation layers 37 are formed on the respective sidewalls of the first to fourth wordline conductive layers 32a to 32d facing the memory columnar semiconductor layer 38, separately for each of the first to fourth wordline conductive layers 32a to 32d. In other words, the charge accumulation layers 36 are formed separately for each memory transistor MTrmn. Accordingly, the non-volatile semiconductor storage device 100 according to the first embodiment may retain charges for each charge accumulation layer 36 formed on each of the first to fourth wordline conductive layers 32a to 32d. That is, the non-volatile semiconductor storage device 100 according to the first embodiment may provide better data retaining characteristics compared to other configurations where the entire sidewalls facing the memory hole 34 are covered with the charge accumulation layers 36. In addition, the non-volatile semiconductor storage device 100 according to the first embodiment may reduce erroneous write operations to irrelevant cells.

Second Embodiment

Figure 11:
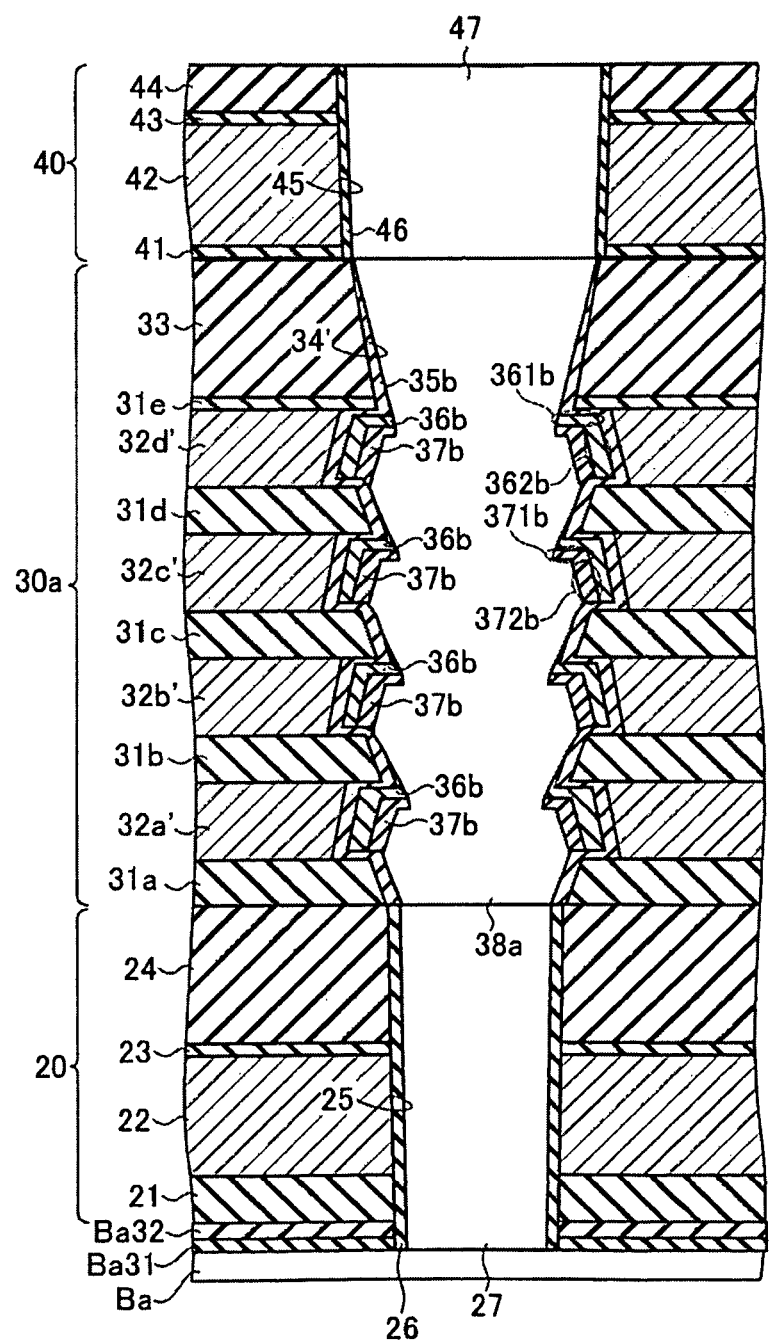
FIG. 11 is a cross-sectional view of a non-volatile semiconductor storage device configuring one memory string according to a second embodiment.

Specific Configuration of Non-Volatile Semiconductor Storage Device in Second Embodiment Referring now to FIG. 11, a specific configuration of a non-volatile semiconductor storage device according to a second embodiment of the present invention will be described below. FIG. 11 is a cross-sectional view of the non-volatile semiconductor storage device configuring one memory string MS according to the second embodiment. Note that the same reference numerals represent the same components as the first embodiment and description thereof will be omitted in the second embodiment.

As illustrated in FIG. 11, the non-volatile semiconductor storage device (one memory string) of the second embodiment has a memory transistor layer 30a different from the first embodiment.

The memory transistor layer 30a has first to fourth wordline conductive layers 32a' to 32d', a memory hole 34', a block insulation layer (first insulation layer) 35b, charge accumulation layers 36b, tunnel insulation layers (second insulation layers) 37b, and a memory columnar semiconductor layer 38a, each of which is different from the first embodiment.

The sidewalls of the first to fourth wordline conductive layers 32a' to 32d' facing the memory columnar semiconductor layer 38a are formed at positions farther away from the central axis of the memory columnar semiconductor layer 38a than the sidewalls of the first to fifth inter-wordline insulating layers 31a to 31e facing the memory columnar semiconductor layer 38a. In other words, the sidewalls of the first to fourth wordline conductive layers 32a' to 32d' are formed to be recessed from the memory columnar semiconductor layer 38a by a predetermined recession width compared to the sidewalls of the first to fifth inter-wordline insulating layers 31a to 31e. The recession width is set substantially equal to or greater than the thickness of the block insulation layer 35b and the charge accumulation layers 36b that are formed on the first to fourth wordline conductive layers 32a' to 32d'.

The memory hole 34' is formed to penetrate the first to fifth inter-wordline insulating layers 31a to 31e and the first to fourth wordline conductive layers 32a' to 32d'. The block insulation layer 35b, the charge accumulation layers 36b, the tunnel insulation layers 37b, and the memory columnar semiconductor layer 38a are formed along the respective shapes of the first to fifth inter-wordline insulating layers 31a to 31e and the first to fourth wordline conductive layers 32a' to 32d'. Similar to the first embodiment, the block insulation layer 35b is formed continuously with the respective sidewalls of the first to fifth inter-wordline insulating layers 31a to 31e and the first to fourth wordline conductive layers 32a' to 32d'. In addition, the charge accumulation layers 36b and the tunnel insulation layers 37b are formed on the block insulation layer 35b separately for each sidewall of each of the first to fourth wordline conductive layers 32a' to 32d'.

The charge accumulation layers 36b have upper portions 361b extending in a direction substantially parallel to the semiconductor substrate Ba and side portions 362b extending in a direction substantially parallel to the lamination direction (substantially perpendicular to the semiconductor substrate Ba). The upper portions 361b are formed in contact with the memory columnar semiconductor layer 38a on their one ends. The side portions 362b are formed in contact with the block insulation layer 35b.

The tunnel insulation layers 37b have upper portions 371b extending in a direction substantially parallel to the semiconductor substrate Ba and side portions 372b extending in a direction substantially parallel to the lamination direction. The upper portions 371b are formed in contact with the upper portions 361b of the charge accumulation layers 36b and the memory columnar semiconductor layer 38a. The side portions 372b are formed in contact with the side portions 362b of the charge accumulation layers 36b and the memory columnar semiconductor layer 38a.

(Manufacturing Process of Non-Volatile Semiconductor Storage Device in Second Embodiment)

Referring now to FIGS. 12 to 15, the manufacturing process of the non-volatile semiconductor storage device according to the second embodiment will be described below. Specifically, FIGS. 12 to 15 illustrate the manufacturing process of the memory transistor layer 30a. Note that FIGS. 12 to 15 mainly illustrate the memory transistor layer 30a and that the source-side selection transistor layer 20 and the drain-side selection transistor layer 40 are omitted therefrom.

Figure 12:
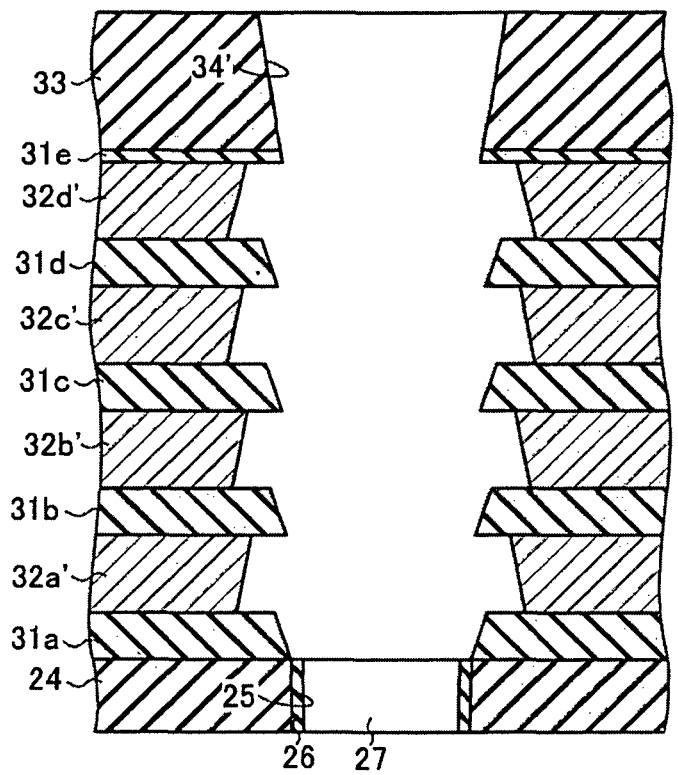
FIG. 12 is a cross-sectional view of the non-volatile semiconductor storage device in a manufacturing process according to the second embodiment.

Firstly, those steps are performed as illustrated in FIGS. 5 and 6 in the first embodiment. Subsequently, as illustrated in FIG. 12, chemical dry etching is performed to form a memory hole 34'. The CDE performed in this step involves a high selection ratio of polysilicon (polycrystalline silicon) compared to silicon oxide ($SiO_2$) and silicon nitride (SiN). Accordingly, through the CDE, the first to fourth wordline conductive layers 32a' to 32d' are etched deeper than the first to fifth inter-wordline insulating layers 31a to 31e. That is, the sidewalls of the first to fourth wordline conductive layers 32a' to 32d' are formed at positions father away from the central axis of the memory hole 34' by a predetermined recession width than the sidewalls of the first to fifth inter-wordline insulating layers 31a to 31e. Consider, in this case, the recession width is equal to or greater than the thickness of the block insulation layer 35b and the charge accumulation layers 36b that are formed in the step described below.

Figure 13:
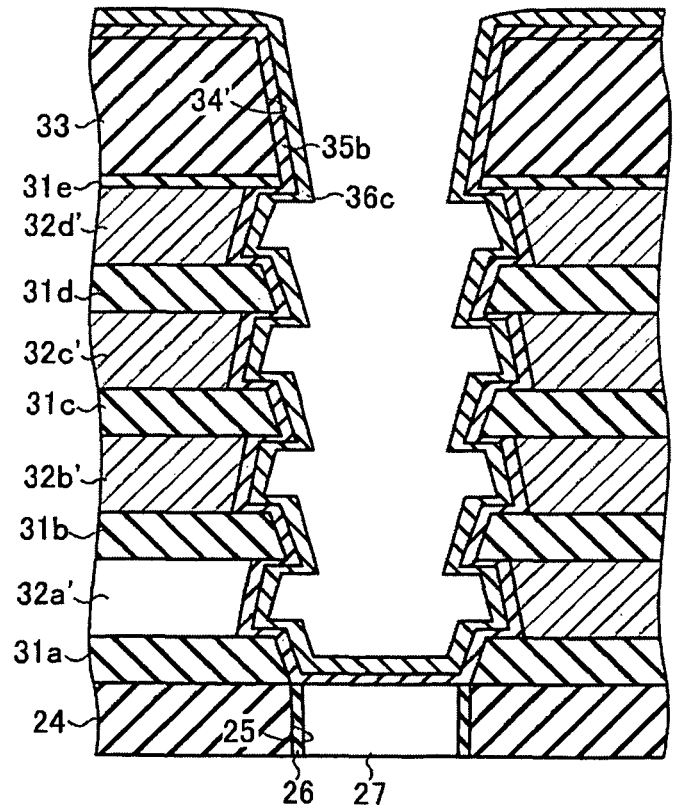
FIG. 13 is a cross-sectional view of the non-volatile semiconductor storage device in the manufacturing process according to the second embodiment.

Then, silicon oxide ($SiO_2$) 35b and silicon nitride (SiN) 36c are sequentially deposited as illustrated in FIG. 13. In this case, for example, the silicon oxide ($SiO_2$) 35b is deposited with a thickness of 5 nm, while the silicon nitride (SiN) 36c is deposited with a thickness of 10 nm. The silicon oxide ($SiO_2$) 35b functions as the block insulation layer 35b.

Figure 14:
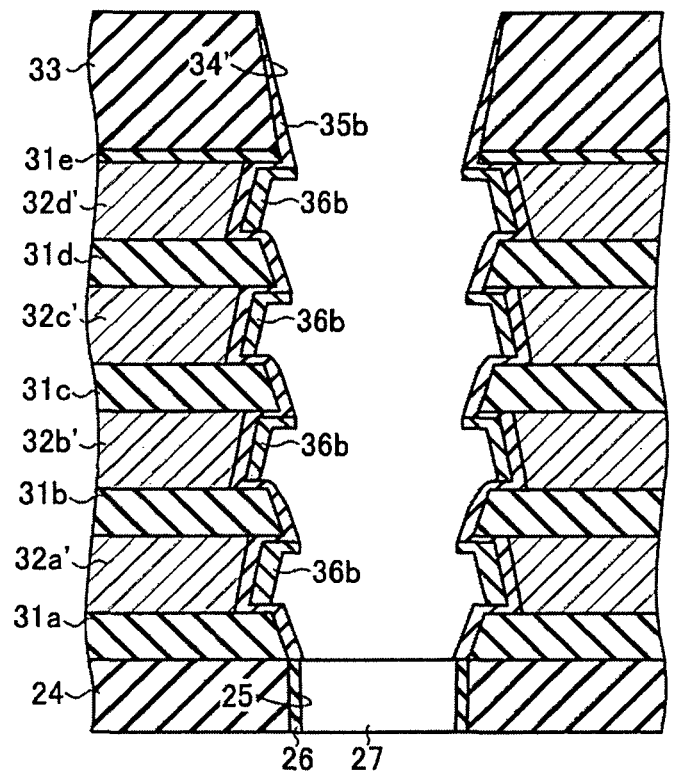
FIG. 14 is a cross-sectional view of the non-volatile semiconductor storage device in the manufacturing process according to the second embodiment.

Subsequently, RIE process is performed as illustrated in FIG. 14. Through this RIE process, those portions of the block insulation layer 35b and the silicon nitride (SiN) 36c are removed that are located on the memory isolation/insulation layer 33. In this case, a sidewall of the first to fourth wordline conductive layers 32a' to 32d' facing the memory columnar semiconductor layer 38 is formed to be inclined such that the distance thereof from a central axis of the columnar semiconductor layer 38 becomes larger at lower position thereof than at upper position thereof. In addition, a sidewall of the first to fifth inter-wordline insulating layers 31a to 31e facing the memory columnar semiconductor layer 38 is formed to be inclined such that the distance thereof from a central axis of the columnar semiconductor layer 38 becomes smaller at lower position thereof than at upper position thereof. Further, the sidewalls of the first to fourth wordline conductive layers 32a' to 32d' are formed at positions farther away from the memory hole 34' by a predetermined recession width than the sidewalls of the first to fifth inter-wordline insulating layers 31a to 31e. As a result, those silicon nitride (SiN) 36c formed on the sidewalls of the first to fourth wordline conductive layers 32a' to 32d' have a smaller area subject to the etching ion irradiation by RIE than those silicon nitride (SiN) 36c formed on the sidewalls of the first to fifth inter-wordline insulating layers 31a to 31e. That is, through this process, the silicon nitride (SiN) 36c remains only on the sidewalls of the first to fourth wordline conductive layers 32a' to 32d'. The remaining silicon nitride (SiN) 36c functions as a charge accumulation layer 36b.

Figure 15:
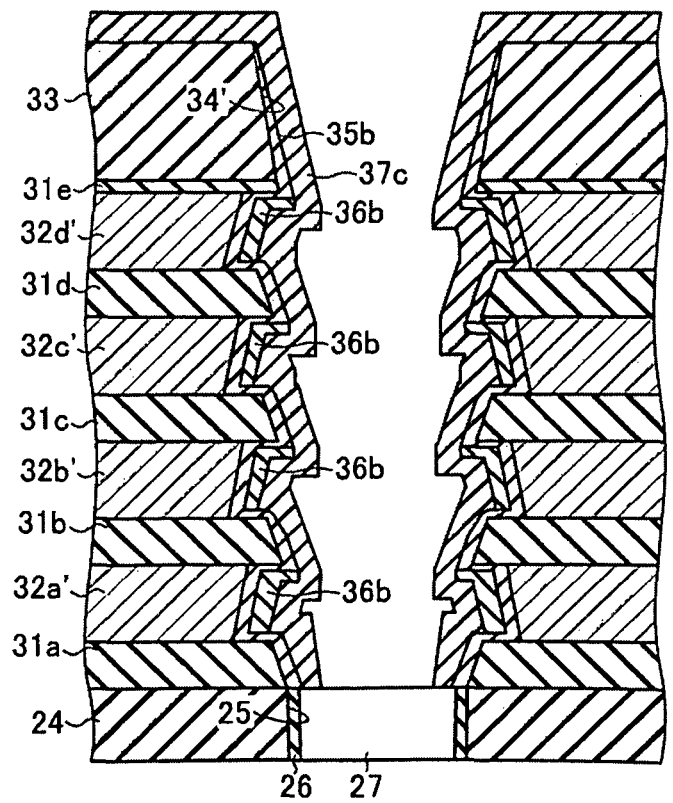
FIG. 15 is a cross-sectional view of the non-volatile semiconductor storage device in the manufacturing process according to the second embodiment.

Then, silicon oxide (SiO$_2$) 37c is deposited as illustrated in FIG. 15.

Subsequently, RIE process is performed as described in the first embodiment. Through this RIE process, those portions of the silicon oxide (SiO$_2$) 37c are removed that are formed on the top surface of the memory isolation/insulation layer 33. In addition, the silicon oxide (SiO$_2$) 37c remains only on the charge accumulation layers 36b (at the sidewalls of the first to fourth wordline conductive layers 32a' to 32d') for a similar reason to the step of forming the charge accumulation layers 36b. The remaining silicon oxide (SiO$_2$) 37c functions as a tunnel insulation layer 37b.

Then, a diluted hydrofluoric acid treatment is performed to remove any natural oxide film that is exposed on the source-side columnar semiconductor layer 27. In this case, the tunnel insulation layers 37b remain substantially unetched by the diluted hydrofluoric acid treatment for a similar reason to the step of forming the charge accumulation layers 36b and the tunnel insulation layers 37b. Subsequently, amorphous silicon (a-Si) is deposited in the memory hole 34', on which RIE process and heat treatment are then performed. Through this process, a memory columnar semiconductor layer 38a is formed in the memory hole 34'. In addition, at this moment, impurity ion may be injected into the upper end of the memory columnar semiconductor layer 38a, and n$^+$ type polysilicon can be provided on the upper portion of the memory columnar semiconductor layer 38a, accordingly. Through the above-mentioned process, the memory transistor layer 30a is formed as illustrated in FIG. 11.

(Advantages of Non-Volatile Semiconductor Storage Device in Second Embodiment)

Advantages of the non-volatile semiconductor storage device according to the second embodiment will now be described below. As can be seen from the above configuration, the non-volatile semiconductor storage device of the second embodiment has the same advantages as the first embodiment.

In addition, in the non-volatile semiconductor storage device and the method of manufacturing the same according to the second embodiment, the sidewalls of the first to fourth wordline conductive layers 32a' to 32d' are formed at positions farther away from the memory hole 34' by a predetermined recession width than the sidewalls of the first to fifth inter-wordline insulating layers 31a to 31e. Accordingly, the method of manufacturing the non-volatile semiconductor storage device according to the second embodiment may further control the amount of etching to be done on the charge accumulation layers 36b compared to the first embodiment.

In addition, with the non-volatile semiconductor storage device and the method of manufacturing the same, the block insulation layer 35b, the charge accumulation layers 36b, and the tunnel insulation layers 37b cannot be etched more than a predetermined amount during the manufacturing process, since the sidewalls of the first to fourth wordline conductive layers 32a' to 32d' and the sidewalls of the first to fifth inter-wordline insulating layers 31a to 31e are formed as described above. In the step of FIG. 14 according to the second embodiment, the block insulation layer 35b formed on the side surfaces of the first to fourth wordline conductive layers 32a' to 32d' may reduce by RIE compared to the first embodiment. Accordingly, the method of manufacturing the non-volatile semiconductor storage device according to the second embodiment may suppress the gate leakage from the charge accumulation layers 36b. That is, the non-volatile semiconductor storage device according to the second embodiment may provide better data retaining characteristics compared to the first embodiment.

Third Embodiment

Figure 16:
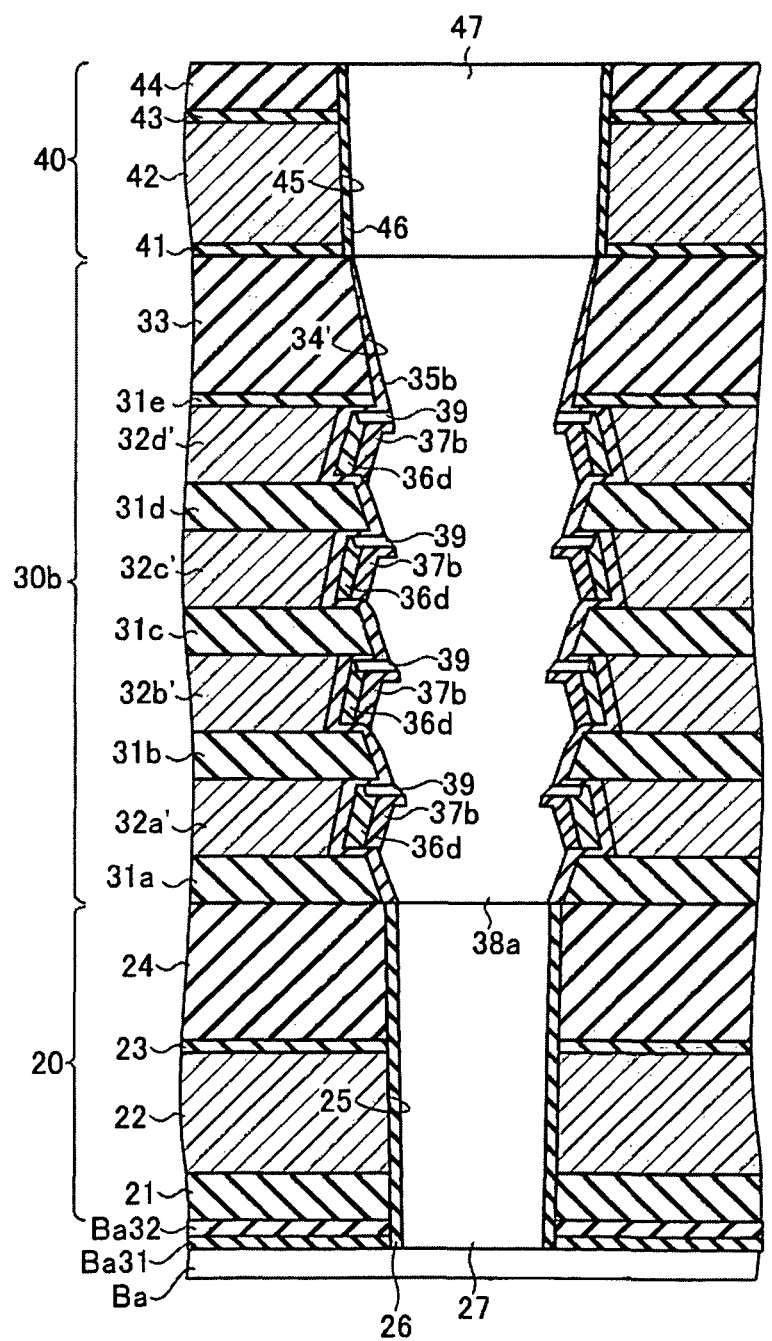
FIG. 16 is a cross-sectional view of a non-volatile semiconductor storage device configuring one memory string according to a third embodiment.

Specific Configuration of Non-Volatile Semiconductor Storage Device in Third Embodiment Referring now to FIG. 16, a specific configuration of a non-volatile semiconductor storage device according to a third embodiment of the present invention will be described below. FIG. 16 is a cross-sectional view of the non-volatile semiconductor storage device configuring one memory string MS according to the third embodiment. Note that the same reference numerals represent the same components as the first and second embodiments and description thereof will be omitted in the third embodiment.

As illustrated in FIG. 16, the non-volatile semiconductor storage device (one memory string) of the third embodiment has a memory transistor layer 30b different from the second embodiment.

The memory transistor layer 30b has charge accumulation layers 36d different from the second embodiment.

The charge accumulation layers 36d are formed only on the sidewall of the block insulation layer 35b at the side of the sidewalls of the first to fourth wordline conductive layers 32a to 32d. That is, voids 39 are formed between the upper portions 371b of the tunnel insulation layers 37b and the block insulation layer 35b, as well as between the charge accumulation layers 36d and the sidewall of the memory columnar semiconductor layer 38a. Note that the above-mentioned configuration is restated as follows: the tunnel insulation layers (second insulation layers) 37b are provided in a part between the respective charge accumulation layers 36d and the sidewall of the memory columnar semiconductor layer 38a.

(Manufacturing Process of Non-Volatile Semiconductor Storage Device in Third Embodiment)

The manufacturing process of the non-volatile semiconductor storage device according to the third embodiment will now be described below. Specifically, the manufacturing process of the memory transistor layer 30b will be described below.

Firstly, through those steps as described in the second embodiment, charge accumulation layers 36b and tunnel insulation layers 37b are formed with shapes as described in the second embodiment. Subsequently, the upper portions 361b of the charge accumulation layers 36b are selectively etched to form charge accumulation layers 36d with shapes as described in the third embodiment. As a result, voids 39 are formed.

Subsequent to the above-mentioned process, those steps are again performed as described in the second embodiment, thereby forming the non-volatile semiconductor storage device according to the third embodiment as illustrated in FIG. 16.

(Advantages of Non-Volatile Semiconductor Storage Device in Third Embodiment)

Advantages of the non-volatile semiconductor storage device according to the third embodiment will now be described below. As can be seen from the above configuration, the non-volatile semiconductor storage device according to the third embodiment has the same advantages as the second embodiment.

In addition, since the non-volatile semiconductor storage device according to the third embodiment has the voids 39, it may achieve to isolate and insulate between the charge accumulation layers 36d and the memory columnar semiconductor layer 38a. Accordingly, the non-volatile semiconductor storage device according to the third embodiment may better prevent charge leakage from the charge accumulation layers 36d into the memory columnar semiconductor layer 38a than in the second embodiment. That is, the non-volatile semiconductor storage device according to the third embodiment may provide better data retaining characteristics compared to the second embodiment.

Fourth Embodiment

Figure 17:
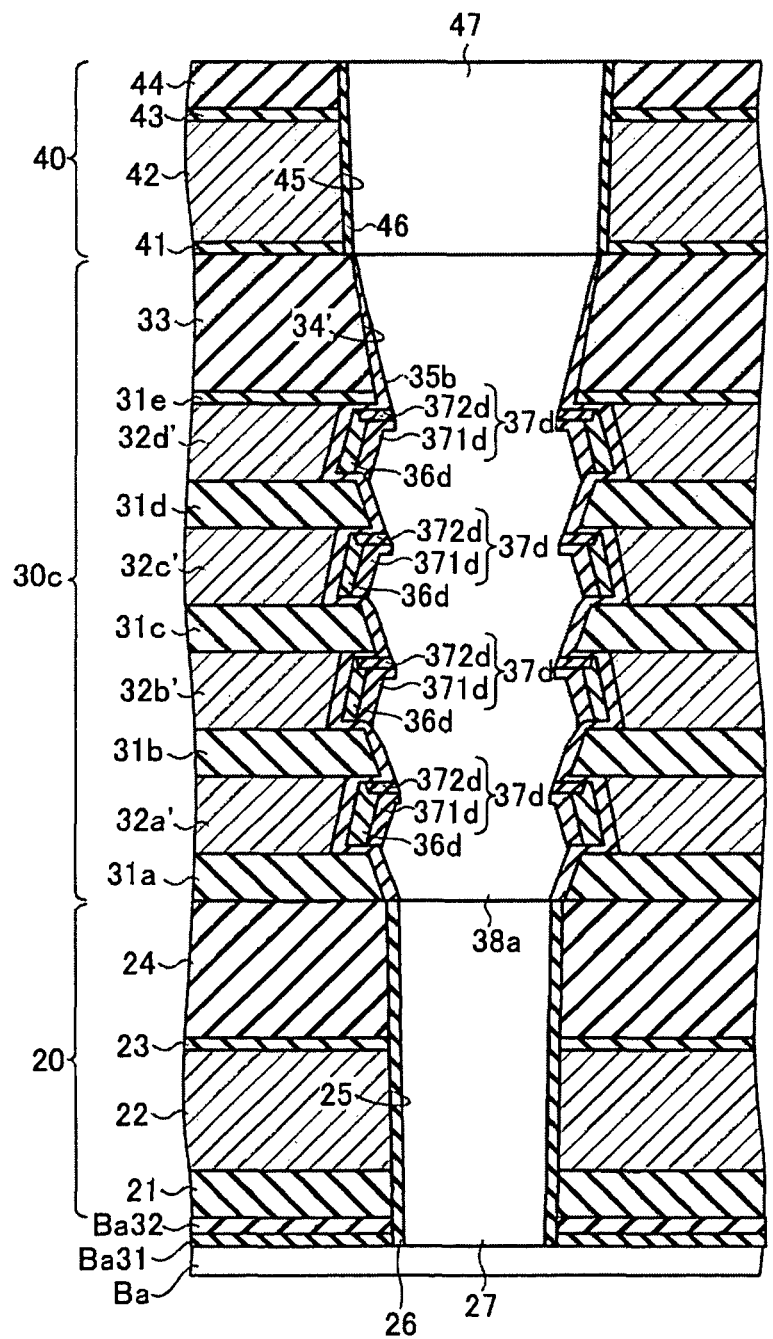
FIG. 17 is a cross-sectional view of a non-volatile semiconductor storage device configuring one memory string according to a fourth embodiment.

Specific Configuration of Non-Volatile Semiconductor Storage Device in Fourth Embodiment Referring now to FIG. 17, a specific configuration of a non-volatile semiconductor storage device according to a fourth embodiment of the present invention will be described below. FIG. 17 is a cross-sectional view of the non-volatile semiconductor storage device configuring one memory cell MS according to the fourth embodiment. Note that the same reference numerals represent the same components as the first to third embodiments and description thereof will be omitted in the fourth embodiment.

As illustrated in FIG. 17, the non-volatile semiconductor storage device (one memory string) according to the fourth embodiment has a memory transistor layer 30c different from the third embodiment.

The memory transistor layer 30c has tunnel insulation layers (second insulation layers) 37d different from the third embodiment.

The tunnel insulation layers 37d has side portions 371d extending substantially in the lamination direction and upper portions 372d extending substantially in the surface direction of the semiconductor substrate Ba. The side portions 371d are formed in contact with the sidewalls of the charge accumulation layers 36d. The upper portions 372d are formed in contact with the upper ends of the side portions 371d, the upper ends of the charge accumulation layers 36d, and the block insulation layer 35b. That is, the tunnel insulation layers 37d are provided to fill up gaps between the respective charge accumulation layers 36d and the sidewall of the memory columnar semiconductor layer 38a.

(Manufacturing Process of Non-Volatile Semiconductor Storage Device in Fourth Embodiment)

The manufacturing process of the non-volatile semiconductor storage device according to the fourth embodiment will now be described below. Specifically, the manufacturing process of the memory transistor layer 30c will be described below.

Firstly, voids 39 are formed through those steps as described in the third embodiment. Subsequently, silicon oxide ($SiO_2$) is deposited to fill up the voids 39. Then, the deposited silicon oxide ($SiO_2$) is removed by etching through a diluted hydrofluoric acid treatment. Through this process, upper portions 372d of the tunnel insulation layers 37d are formed.

Subsequent to the above-mentioned process, those steps are performed as described in the second embodiment, thereby forming the non-volatile semiconductor storage device according to the fourth embodiment as illustrated FIG. 17.

(Advantages of Non-Volatile Semiconductor Storage Device in Fourth Embodiment)

Advantages of the non-volatile semiconductor storage device according to the fourth embodiment will now be described below. As can be seen from the above configuration, the non-volatile semiconductor storage device according to the fourth embodiment has the same advantages as the second embodiment.

In addition, since the non-volatile semiconductor storage device according to the fourth embodiment has the tunnel insulation layers 37d that are provided to fill up the gaps between the respective sidewalls of the respective charge accumulation layers 36d and the sidewall of the memory columnar semiconductor layer 38a, it may achieve to isolate and insulate between the charge accumulation layers 36d and the memory columnar semiconductor layer 38a. Accordingly, the non-volatile semiconductor storage device according to the fourth embodiment may better prevent charge leakage form the charge accumulation layers 36d into the memory columnar semiconductor layer 38a than in the second embodiment. That is, the non-volatile semiconductor storage device according to the fourth embodiment may provide better data retaining characteristics compared to the second embodiment.

Fifth Embodiment

Figure 18:
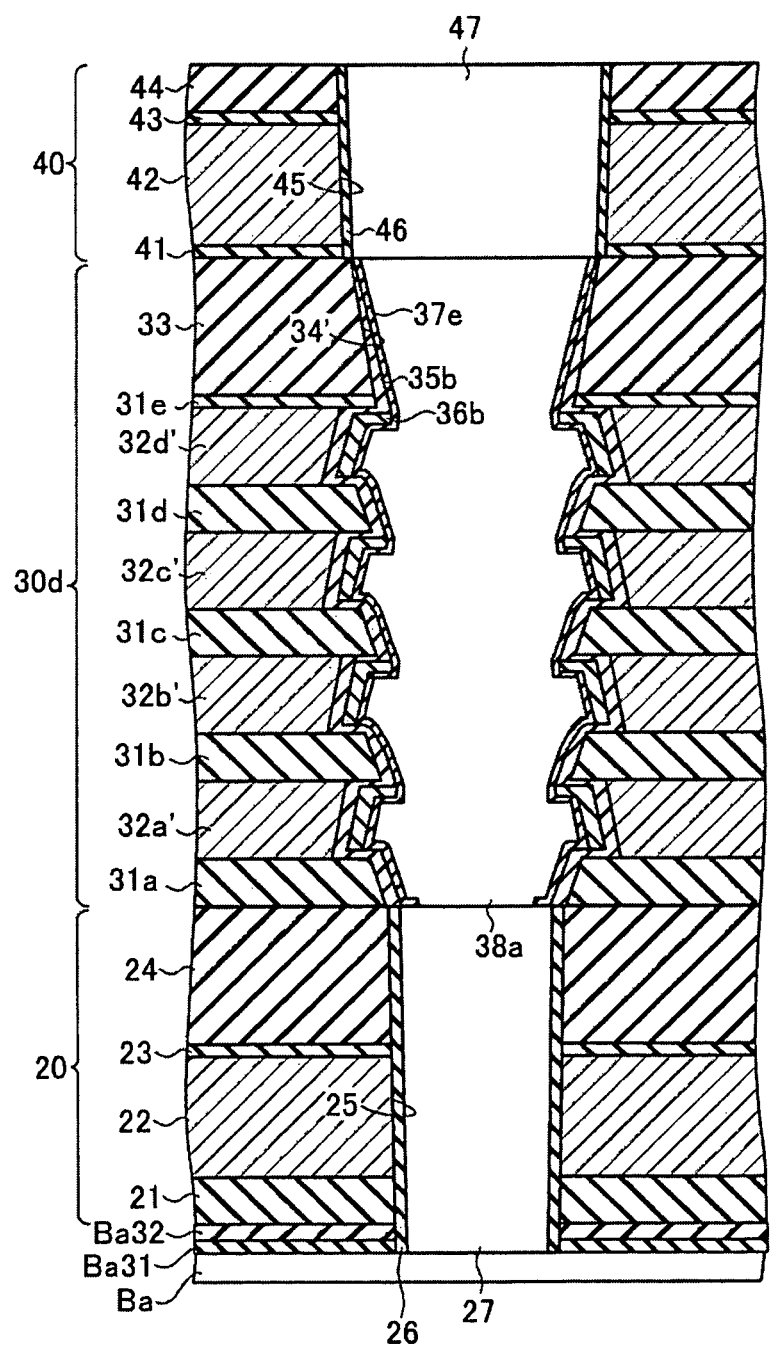
FIG. 18 is a cross-sectional view of a non-volatile semiconductor storage device configuring one memory string according to a fifth embodiment.

Specific Configuration of Non-Volatile Semiconductor Storage Device in Fifth Embodiment Referring now to FIG. 18, a specific configuration of a non-volatile semiconductor storage device according to a fifth embodiment of the present invention will be described below. FIG. 18 is a cross-sectional view of the non-volatile semiconductor storage device configuring one memory string MS according to the fifth embodiment. Note that the same reference numerals represent the same components as the first to fourth embodiments and description thereof will be omitted in the fifth embodiment.

As illustrated in FIG. 18, the non-volatile semiconductor storage device (one memory string) according to the fifth embodiment has a memory transistor layer 30d different from the first to fourth embodiments.

The memory transistor layer 30d has tunnel insulation layers (second insulation layers) 37e different from the first to fourth embodiments. Unlike the first to fourth embodiments, the tunnel insulation layers 37e are formed to cover the respective sidewalls of the charge accumulation layers 36b and the sidewall of the block insulation layer 35b in the memory hole 34'. That is, the tunnel insulation layers 37e are formed integrally and continuously with the entire side surface of the memory columnar semiconductor layer 38a.

(Manufacturing Process of Non-Volatile Semiconductor Storage Device in Fifth Embodiment)

Figure 19:
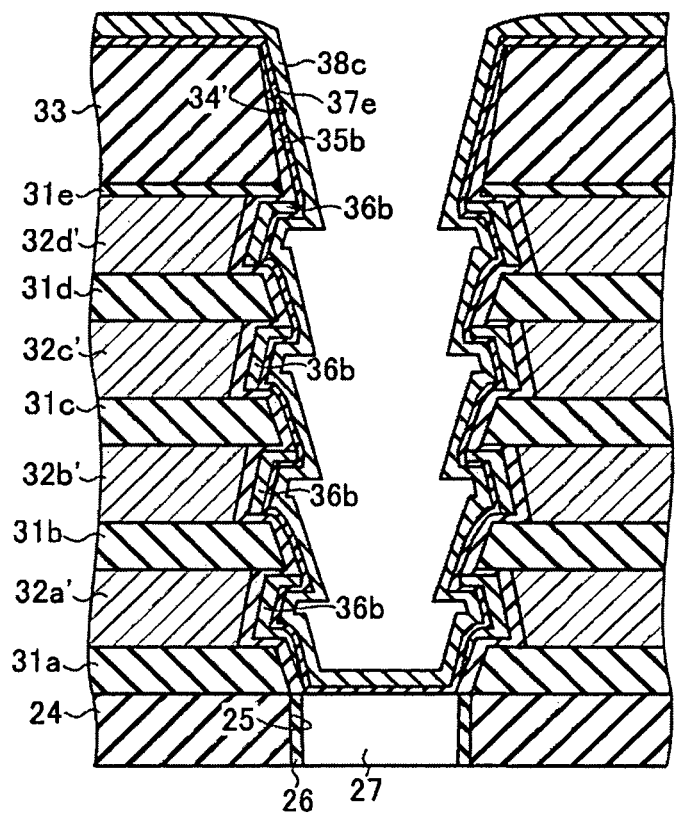
FIG. 19 is a cross-sectional view of the non-volatile semiconductor storage device in a manufacturing process according to the fifth embodiment.
Figure 20:
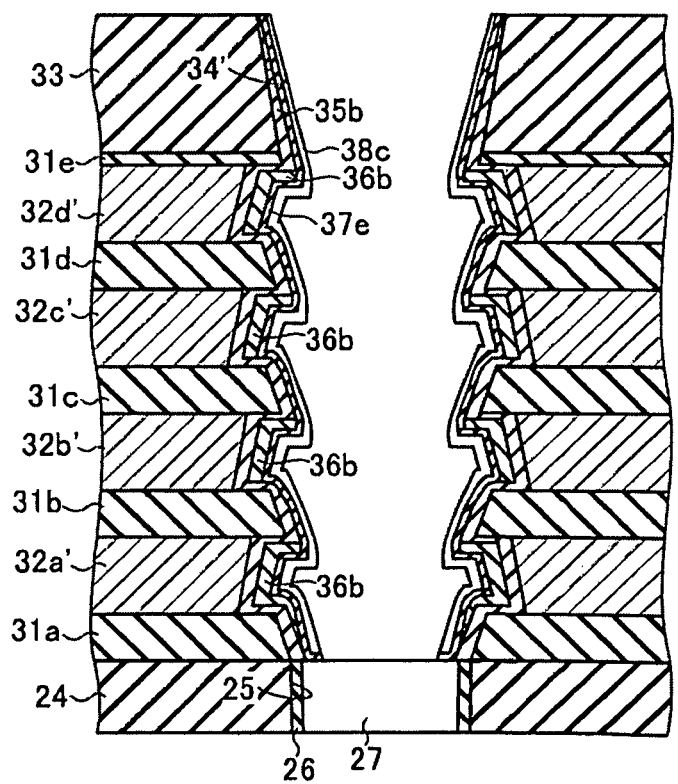
FIG. 20 is a cross-sectional view of the non-volatile semiconductor storage device in the manufacturing process according to the fifth embodiment.

Referring now to FIGS. 19 and 20, the manufacturing process of the non-volatile semiconductor storage device according to the fifth embodiment will be described below. Specifically, FIGS. 19 and 20 illustrate the manufacturing process of the memory transistor layer 30d. Note that FIGS. 19 and 20 mainly illustrate the memory transistor layer 30d and that the source-side selection transistor layer 20 and the drain-side selection transistor layer 40 are omitted therefrom.

Firstly, those steps are performed as illustrated in FIGS. 12 through 15 in the second embodiment. Subsequently, amorphous silicon (a-Si) 38c is deposited on the tunnel insulation layers 37e as illustrated in FIG. 19.

Then, RIE process is performed as illustrated in FIG. 20 to remove by etching those portions of the tunnel insulation layers 37e and the amorphous silicon (a-Si) 38c that are located on the memory isolation/insulation layer 33. In addition, through this process, those portions of the tunnel insulation layers 37e and the amorphous silicon (a-Si) 38c are also removed by etching that are formed on the bottom portion of the memory hole 34'. Subsequently, a diluted hydrofluoric acid treatment is performed to remove any natural oxide film that is exposed on the source-side columnar semiconductor layer 27. In this case, since the amorphous silicon 38c is not removed by the diluted hydrofluoric acid treatment, the tunnel insulation layers 37e are not also removed.

Subsequent to the above-mentioned process, those steps are performed as described in the second embodiment, thereby forming the non-volatile semiconductor storage device according to the fifth embodiment as illustrated in FIG. 18.

(Advantages of Non-Volatile Semiconductor Storage Device in Fifth Embodiment)

Advantages of the non-volatile semiconductor storage device according to the fifth embodiment will now be described below. As can be seen from the above configuration, the non-volatile semiconductor storage device according to the fifth embodiment has the same advantages as the second embodiment.

In addition, in the method of manufacturing the non-volatile semiconductor storage device according to the fifth embodiment, a hydrofluoric acid treatment is performed with the tunnel insulation layers 37e covered with the amorphous silicon 38c. That is, the tunnel insulation layers 37e are not removed by etching through the hydrofluoric acid treatment. Accordingly, the method of manufacturing the non-volatile semiconductor storage device according to the fifth embodiment may facilitate control of the film thickness of the tunnel insulation layers 37e. In other words, the method of manufacturing the non-volatile semiconductor storage device according to the fifth embodiment may provide easy control of the threshold of the memory transistors MTrmn.

Sixth Embodiment

Figure 21:
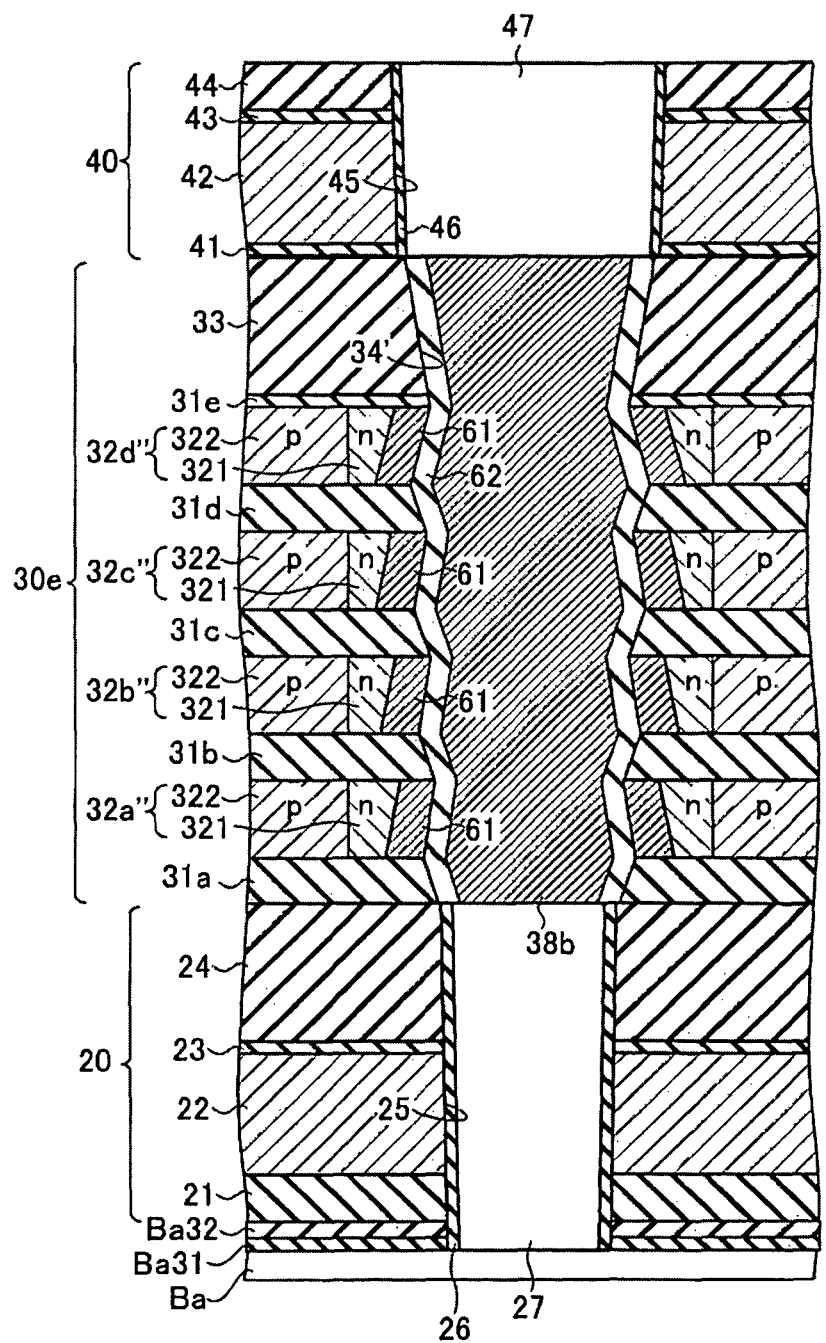
FIG. 21 is a cross-sectional view of a non-volatile semiconductor storage device configuring one memory string according to a sixth embodiment.

Specific Configuration of Non-Volatile Semiconductor Storage Device in Sixth Embodiment Referring now to FIG. 21, a specific configuration of a non-volatile semiconductor storage device according to a sixth embodiment of the present invention will be described below. FIG. 21 is a cross-sectional view of the non-volatile semiconductor storage device configuring one memory string MS according to the sixth embodiment. Note that the same reference numerals represent the same components as the first to fifth embodiments and description thereof will be omitted in the sixth embodiment.

The non-volatile semiconductor storage device according to the sixth embodiment has a memory transistor layer 30e different from the first to fifth embodiments.

The memory transistor layer 30e has first to fourth wordline conductive layers 32a" to 32d" different from the second to fifth embodiments. In addition, the memory transistor layer 30 has a memory columnar conductive layer 38b, instead of the memory columnar semiconductor layer 38 (38a). Further, the memory transistor layer 30e has electrode layers 61 and a resistance-varying layer (memory layer) 62, instead of the block insulation layer 35, the charge accumulation layers 36, and the tunnel insulation layers 37 in the first to fifth embodiments.

Similar to the second embodiment, the sidewalls of the first to fourth wordline conductive layers 32a" to 32d" are formed to be inclined such that the distance thereof from a central axis of the columnar semiconductor layer 38b becomes larger at lower position thereof than at upper position thereof. In addition, the sidewalls of the first to fourth wordline conductive layers 32a" to 32d' are formed at positions farther away from the memory columnar conductive layer 38b by a predetermined recession width than the sidewalls of the first to fifth inter-wordline insulating layers 31a to 31e facing the memory columnar conductive layer 38b.

Unlike the second embodiment, the first to fourth wordline conductive layers 32a" to 32d" have those portions adjacent to the memory columnar conductive layer 38b that are composed of n-type polysilicon 321 and other portions that are composed of p-type polysilicon 322. That is, the first to fourth wordline conductive layers 32a" to 32d" configure diodes by p-n junctions.

The memory columnar conductive layer 38b is composed of titanium nitride (TiN). The memory columnar conductive layer 38b is formed with an inclination along the sidewalls of the first to fifth inter-wordline insulating layers 31a to 31e and the sidewalls of the electrode layers 61.

The electrode layers 61 are composed of titanium nitride (TiN). The electrode layers 61 are formed separately for each of the first to fourth wordline conductive layers 32a" to 32d" at the sides of the memory columnar conductive layer 38b.

The resistance-varying layer 62 is composed of nickel oxide (NiO). The resistance-varying layer 62 is formed between the sidewall of the memory columnar conductive layer 38b and the sidewalls of the first to fifth inter-wordline insulating layers 31a to 31e, the sidewalls of the electrode layers 61, as well as the sidewall of the memory isolation/insulation layer 33, respectively.

In this configuration, nickel oxide (NiO) included in the resistance-varying layer 62 changes its resistance depending on the applied voltage. That is, by reading change in resistance, the first to fourth wordline conductive layers 32a" to 32d", the memory columnar conductive layer 38b, the electrode layers 61, and the resistance-varying layer 62 function as memory for storing data.

(Advantages of Non-Volatile Semiconductor Storage Device in Sixth Embodiment)

Advantages of the non-volatile semiconductor storage device according to the sixth embodiment will now be described below. The non-volatile semiconductor storage device according to the sixth embodiment has the same advantages as the second embodiment using resistance-varying devices. Further, the memory layer (the resistance-varying layer 62) may be formed thinner than in the first to fifth embodiments. Accordingly, the memory columnar conductive layer 38b may have a smaller radius than in the first to fifth embodiments. That is, the non-volatile semiconductor storage device according to the sixth embodiment may achieve further integration of the memory cells.

Other Embodiments

While embodiments of the non-volatile semiconductor storage device have been described, the present invention is not intended to be limited to the disclosed embodiments and various other changes, additions, replacements or the like may be made thereto without departing from the spirit of the invention.

What is claimed is:

1. A non-volatile semiconductor storage device comprising a plurality of memory strings with a plurality of electrically rewritable memory cells connected in series,
   each of the memory strings comprising:
      a columnar semiconductor layer extending in a direction perpendicular to a substrate;
      a plurality of conductive layers formed at a sidewall of the columnar semiconductor layer via memory layers; and
      interlayer insulation layers formed above or below the conductive layers,
   a sidewall of each of the conductive layers facing the columnar semiconductor layer being formed to be inclined such that the distance thereof from a central axis of the columnar semiconductor layer becomes larger at lower position thereof than at upper position thereof, and
   a sidewall of each of the interlayer insulation layers facing the columnar semiconductor layer being formed to be inclined such that the distance thereof from a central axis of the columnar semiconductor layer becomes smaller at lower position thereof than at upper position thereof.

2. The non-volatile semiconductor storage device according to claim 1, wherein
   a sidewall of the conductive layers facing the columnar semiconductor layer is formed at positions farther away from the columnar semiconductor layer than a sidewall of the interlayer insulation layers facing the columnar semiconductor layer.

3. The non-volatile semiconductor storage device according to claim 2, wherein
   the memory layers are charge accumulation layers that are configured to be able to accumulate charges.

4. The non-volatile semiconductor storage device according to claim 3, comprising:
   a first insulation layer formed between the charge accumulation layers and the conductive layers; and
   a second insulation layer formed between the charge accumulation layers and the columnar semiconductor layer,
   wherein voids are formed between the charge accumulation layers and the columnar semiconductor layer.

5. The non-volatile semiconductor storage device according to claim 3, comprising:
   a first insulation layer formed between the charge accumulation layers and the conductive layers; and
   a second insulation layer formed between the charge accumulation layers and the columnar semiconductor layer,
   wherein the second insulation layer is formed integrally and continuously with the entire side surface of the columnar semiconductor layer.

6. The non-volatile semiconductor storage device according to claim 2, wherein
   the memory layers have resistance-varying devices.

7. The non-volatile semiconductor storage device according to claim 6, wherein
   respective ends of the conductive layers in contact with the memory layers configure diodes.

8. The non-volatile semiconductor storage device according to claim 1, wherein
   the memory layers are charge accumulation layers that are configured to be able to accumulate charges.

9. The non-volatile semiconductor storage device according to claim 8, comprising:
   a first insulation layer formed between the charge accumulation layers and the conductive layers; and
   a second insulation layer formed between the charge accumulation layers and the columnar semiconductor layer,
   wherein voids are formed between the charge accumulation layers and the columnar semiconductor layer.

10. The non-volatile semiconductor storage device according to claim 8, comprising:
    a first insulation layer formed between the charge accumulation layers and the conductive layers; and
    a second insulation layer formed between the charge accumulation layers and the columnar semiconductor layer,
    wherein the second insulation layer is formed integrally and continuously with the entire side surface of the columnar semiconductor layer.

11. The non-volatile semiconductor storage device according to claim 1, wherein
    the memory layers have resistance-varying devices.

12. The non-volatile semiconductor storage device according to claim 11, wherein
    respective ends of the conductive layers in contact with the memory layers configure diodes.

13. A non-volatile semiconductor storage device comprising a plurality of memory strings with a plurality of electrically rewritable memory cells connected in series,
    each of the memory strings comprising:
       a columnar semiconductor layer extending in a direction perpendicular to a substrate;
       a plurality of conductive layers formed at the side of the sidewall of the columnar semiconductor layer via memory layers; and
       interlayer insulation layers formed one above the other with the conductive layers,
    a sidewall of the conductive layers facing the columnar semiconductor layer being formed at positions farther away from the columnar semiconductor layer than a sidewall of the interlayer insulation layers facing the columnar semiconductor layer; and
    the sidewall of each of the conductive layers having a first incline and the sidewall of each of the interlayer insulation layers having a second incline different from the first incline.

14. The non-volatile semiconductor storage device according to claim 13, wherein
    the memory layers are charge accumulation layers that are configured to be able to accumulate charges.

15. The non-volatile semiconductor storage device according to claim 13, comprising:
    a first insulation layer formed between the charge accumulation layers and the conductive layers; and
    a second insulation layer formed between the charge accumulation layers and the columnar semiconductor layer,
    wherein voids are formed between the charge accumulation layers and the columnar semiconductor layer.

16. The non-volatile semiconductor storage device according to claim 13, comprising:
 a first insulation layer formed between the charge accumulation layers and the conductive layers; and
 a second insulation layer formed between the charge accumulation layers and the columnar semiconductor layer,
 wherein the first insulation layer is formed integrally and continuously with the entire side surface of the columnar semiconductor layer.

17. The non-volatile semiconductor storage device according to claim 13, wherein
 the memory layers have resistance-varying devices.

18. The non-volatile semiconductor storage device according to claim 17, wherein
 respective ends of the conductive layers in contact with the memory layers configure diodes.

\* \* \* \* \*